US010770258B2

(12) United States Patent
Jiang et al.

(10) Patent No.: US 10,770,258 B2
(45) Date of Patent: Sep. 8, 2020

(54) METHOD AND SYSTEM FOR EDGE-OF-WAFER INSPECTION AND REVIEW

(71) Applicant: KLA-Tencor Corporation, Milpitas, CA (US)

(72) Inventors: Xinrong Jiang, Palo Alto, CA (US); Christopher Sears, Fremont, CA (US); Harsh Sinha, Santa Clara, CA (US); David Trease, Milpitas, CA (US); David Kaz, Oakland, CA (US); Wei Ye, Milpitas, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 16/105,632

(22) Filed: Aug. 20, 2018

(65) Prior Publication Data
US 2019/0006143 A1 Jan. 3, 2019

Related U.S. Application Data

(63) Continuation of application No. 15/231,728, filed on Aug. 8, 2016, now Pat. No. 10,056,224.
(Continued)

(51) Int. Cl.
H01J 37/26 (2006.01)
H01J 37/22 (2006.01)
H01J 37/153 (2006.01)

(52) U.S. Cl.
CPC ..... H01J 37/153 (2013.01); H01J 2237/1532 (2013.01); H01J 2237/1534 (2013.01); H01J 2237/1536 (2013.01)

(58) Field of Classification Search
CPC ............ H01J 37/153; H01J 2237/1532; H01J 2237/1534; H01J 2237/221;
(Continued)

(56) References Cited

U.S. PATENT DOCUMENTS 3,924,156 A * 12/1975 Doran ................... H01J 37/153
315/382
4,420,691 A * 12/1983 Zasio .................. H01J 37/3045
250/491.1
(Continued)

FOREIGN PATENT DOCUMENTS

CN 101145575 A 3/2008
CN 101241084 A 8/2008
(Continued)

OTHER PUBLICATIONS

Office Action dated Jul. 2, 2019 for Chinese Patent Application No. 201680045818.2.
(Continued)

Primary Examiner — David A Vanore
(74) Attorney, Agent, or Firm — Suiter Swantz pc llo

(57) ABSTRACT

An electron-optical system for inspecting or reviewing an edge portion of a sample includes an electron beam source configured to generate one or more electron beams, a sample stage configured to secure the sample and an electron-optical column including a set of electron-optical elements configured to direct at least a portion of the one or more electron beams onto an edge portion of the sample. The system also includes a sample position reference device disposed about the sample and a guard ring device disposed between the edge of the sample and the sample position reference device to compensate for one or more fringe fields. One or more characteristics of the guard ring device are adjustable. The
(Continued)

system also includes a detector assembly configured to detect electrons emanating from the surface of the sample.

19 Claims, 19 Drawing Sheets

Related U.S. Application Data

(60) Provisional application No. 62/203,276, filed on Aug. 10, 2015.

(58) Field of Classification Search
CPC ........... H01J 2237/022; H01J 2237/057; H01J 2237/153; H01J 2237/1536; H01J 2237/28; H01J 2237/2814; H01J 2237/30455; H01J 2237/30472; H01J 37/026; H01J 37/22
USPC ............ 250/310, 307, 492.22, 396 R, 491.1, 250/492.1, 492.2, 306, 311, 397, 492.3
See application file for complete search history.

(56) References Cited

U.S. PATENT DOCUMENTS

| | | | | |
|---|---|---|---|---|
| 5,973,323 | A * | 10/1999 | Adler | H01J 37/285 250/307 |
| 6,352,799 | B1 * | 3/2002 | Nakasuji | B82Y 10/00 250/492.22 |
| 6,664,546 | B1 * | 12/2003 | McCord | H01J 37/28 250/310 |
| 7,205,539 | B1 * | 4/2007 | Schmidt | G01N 23/22 250/307 |
| 8,247,782 | B2 * | 8/2012 | Edinger | C23F 4/00 250/306 |
| 9,082,580 | B2 | 7/2015 | Sears | |
| 9,443,693 | B2 | 9/2016 | Sears | |
| 10,056,224 | B2 * | 8/2018 | Jiang | H01J 37/153 |
| 2004/0149906 | A1 * | 8/2004 | Mankos | H01J 37/20 250/310 |
| 2004/0262540 | A1 * | 12/2004 | Nagaseki | H01L 21/67115 250/492.1 |
| 2006/0248967 | A1 * | 11/2006 | Tsukuda | G11B 7/261 73/865.9 |
| 2007/0069158 | A1 * | 3/2007 | Ohnishi | H01J 37/304 250/492.22 |
| 2007/0109524 | A1 * | 5/2007 | Kawakubo | G03F 7/705 355/77 |
| 2008/0212084 | A1 | 9/2008 | Watkins et al. | |
| 2008/0232672 | A1 * | 9/2008 | Birkner | G01N 21/9503 382/145 |
| 2010/0096550 | A1 * | 4/2010 | Yamazaki | G01N 23/2251 250/310 |
| 2011/0272578 | A1 * | 11/2011 | Hirose | H01J 37/153 250/310 |
| 2012/0287257 | A1 * | 11/2012 | Chino | H01J 37/22 348/80 |
| 2015/0206709 | A1 * | 7/2015 | Nakayamada | H01J 37/3045 250/491.1 |
| 2016/0071685 | A1 * | 3/2016 | Kawanishi | H01J 37/18 250/396 R |

FOREIGN PATENT DOCUMENTS

| | | |
|---|---|---|
| CN | 106030414 A | 10/2016 |
| JP | 2000357483 A | 12/2000 |
| JP | 2004235149 A | 8/2004 |
| JP | 2009302415 A | 12/2009 |
| WO | 2008103994 A2 | 8/2008 |

OTHER PUBLICATIONS

English Translation of Office Action dated Jul. 2, 2019 for Chinese Patent Application No. 201680045818.2.
Office Action dated Jul. 14, 2020 for JP Patent Application No. 2018-506963.

* cited by examiner

METHOD AND SYSTEM FOR EDGE-OF-WAFER INSPECTION AND REVIEW

CROSS-REFERENCE TO RELATED APPLICATION

The present application is related to and claims benefit of the earliest available effective filing date from the following applications. The present application constitutes a continuation patent application of U.S. Patent Application entitled METHOD AND SYSTEM FOR EDGE-OF-WAFER INSPECTION AND REVIEW, naming Xinrong Jiang, Christopher Sears, Harsh Sinha, David Trease, David Kaz and Wei Ye as inventors, filed Aug. 8, 2016, application Ser. No. 15/231,728, which is a regular (non-provisional) patent application of U.S. Provisional Application Ser. No. 62/203,276, filed Aug. 10, 2015, entitled REVIEW AND INSPECTION AT EDGE OF WAFER IN AN ELECTRON OPTICAL APPARATUS, naming Xinrong Jiang, Christopher Sears, Harsh Sinha, David Trease, David Kaz and Wei Ye as inventors, which is incorporated herein by reference in the entirety. U.S. patent application Ser. No. 15/231,728 and U.S. Provisional Patent Application No. 62/203,276 are incorporated by reference herein in their entirety

TECHNICAL FIELD

The present invention generally relates to electron-optical inspection and review, and, in particular, an electron-optical apparatus for inspecting and reviewing an edge-portion of a semiconductor wafer.

BACKGROUND

Fabricating semiconductor devices such as logic and memory devices typically includes processing a substrate such as a semiconductor wafer using a large number of semiconductor fabrication processes to form various features and multiple levels of the semiconductor devices. As semiconductor device size become smaller and smaller, it becomes critical to develop enhanced semiconductor wafer inspection and review devices and procedures. Such inspection technologies include electron beam based inspection or review systems, such as, edge-of-wafer electron inspection or defect review tools.

The edge region of a wafer, such as 300 mm wafer, may represent approximately 10% of the total area used for device formation. However, the yield in the edge region may decrease by around 50% for various reasons. Interest in improved edge-of-wafer (EOW) inspection and review technologies to improve yield at the edge of wafers continues to grow. Due to the existence of fringe fields and the effects of such fringe fields, the EOW region of a given wafer is difficult to inspect and review. The existence of fringe fields may result in electron beam position error, defocus, astigmatism and/or blur.

Currently, defect location accuracy (DLA) and image quality (IQ) start degradation at approximately 5 mm from the wafer edge due to the existence of a fringe dipole field and fringe quadrupole field at the EOW. The fringe fields deflect electron beams and impact beam focus and stigmatism, especially for low landing energy (LE) beams. At the EOW, beam position, focus and stigmatism deviate from their calibrated values, so that defect review images become unusable at distances such as 1.9-5 mm towards the wafer edge. As such, it would be advantageous to provide a system and method that provides improved electron imaging at the edge regions of wafers so as to remedy the shortcomings identified above.

SUMMARY

An apparatus for fringe field compensation is disclosed, in accordance with one or more embodiments of the present disclosure. In one illustrative embodiment, the apparatus includes a guard ring device for compensating for one or more fringe fields in an electron-optical system. In another illustrative embodiment, the guard ring device is disposed between an edge portion of a sample and a sample position reference device. In another illustrative embodiment, the apparatus includes a controller. In another illustrative embodiment, the controller is configured to adjust one or more characteristics of the guard ring device so as to cause the guard ring device to compensate for the one or more fringe fields in the electron-optical system.

An electron-optical system is disclosed, in accordance with one or more embodiments of the present disclosure. In one illustrative embodiment, the electron-optical system includes an electron beam source configured to generate one or more electron beams. In another illustrative embodiment, the electron-optical system includes a sample stage configured to secure a sample. In another illustrative embodiment, the electron-optical system includes an electron-optical column including a set of electron-optical elements configured to direct at least a portion of the one or more electron beams onto an edge portion of the sample. In another illustrative embodiment, the electron-optical system includes a sample position reference device disposed about the sample. In another illustrative embodiment, the electron-optical system includes a guard ring device disposed between the edge of the sample and the sample position reference device to compensate for one or more fringe fields, wherein one or more characteristics of the guard ring device are adjustable. In another illustrative embodiment, the electron-optical system includes a detector assembly configured to detect electrons emanating from the surface of the sample.

An electron-optical system is disclosed, in accordance with one or more embodiments of the present disclosure. In one illustrative embodiment, the electron-optical system includes an electron beam source configured to generate one or more electron beams. In another illustrative embodiment, the electron-optical system includes a sample stage configured to secure a sample. In another illustrative embodiment, the electron-optical system includes an electron-optical column including a set of electron-optical elements configured to direct at least a portion of the one or more electron beams onto an edge portion of the sample. In another illustrative embodiment, the electron-optical system includes a detector assembly configured to detect electrons emanating from the surface of the sample. In another illustrative embodiment, the electron-optical system includes a controller. In another illustrative embodiment, the controller is communicatively coupled to one or more portions of at least one of the electron beam source or the set of electron-optical elements of the electron optical column or the stage. In another illustrative embodiment, the controller is configured to: receive one or more parameters representative of one or more characteristics of the one or more electron beams at an edge portion of the sample; generate a look-up table for compensating for one or more fringe fields within the electron-optical system; and adjust one or more characteristics of the electron-optical system based on the generated look-up table.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which:

FIGS. 1H-1I illustrate graphs of fringe dipole field as a function of position along the optical axis for a variety of use cases, in accordance with one or more embodiments of the present disclosure.

DETAILED DESCRIPTION OF THE INVENTION

Reference will now be made in detail to the subject matter disclosed, which is illustrated in the accompanying drawings.

Referring generally to FIGS. 1A through 4C a system and method for compensating for fringe fields in an electron-optical system is described in accordance with the present disclosure. Embodiments of the present disclosure are directed to an electron-optical system capable of compensating for fringe fields (e.g., dipole fields, quadrupole fields, etc.) at the edge of a wafer during inspection and/or review. In some embodiments, the fringe fields are reduced and/or redistributed utilizing an adjustable guard ring device. The height and/or voltage of the guard ring device may be adjusted so as to reach an adequate level of compensation of the fringe fields, allowing improved electron beam imaging at the edge of the wafer. In other embodiments, fringe fields are reduced and/or redistributed utilizing a look-up-table, allowing the system to adjust one or more components of the electron-optical system in order to mitigate the effect of fringe fields at or near the edge of the wafer.

Figure 1A:
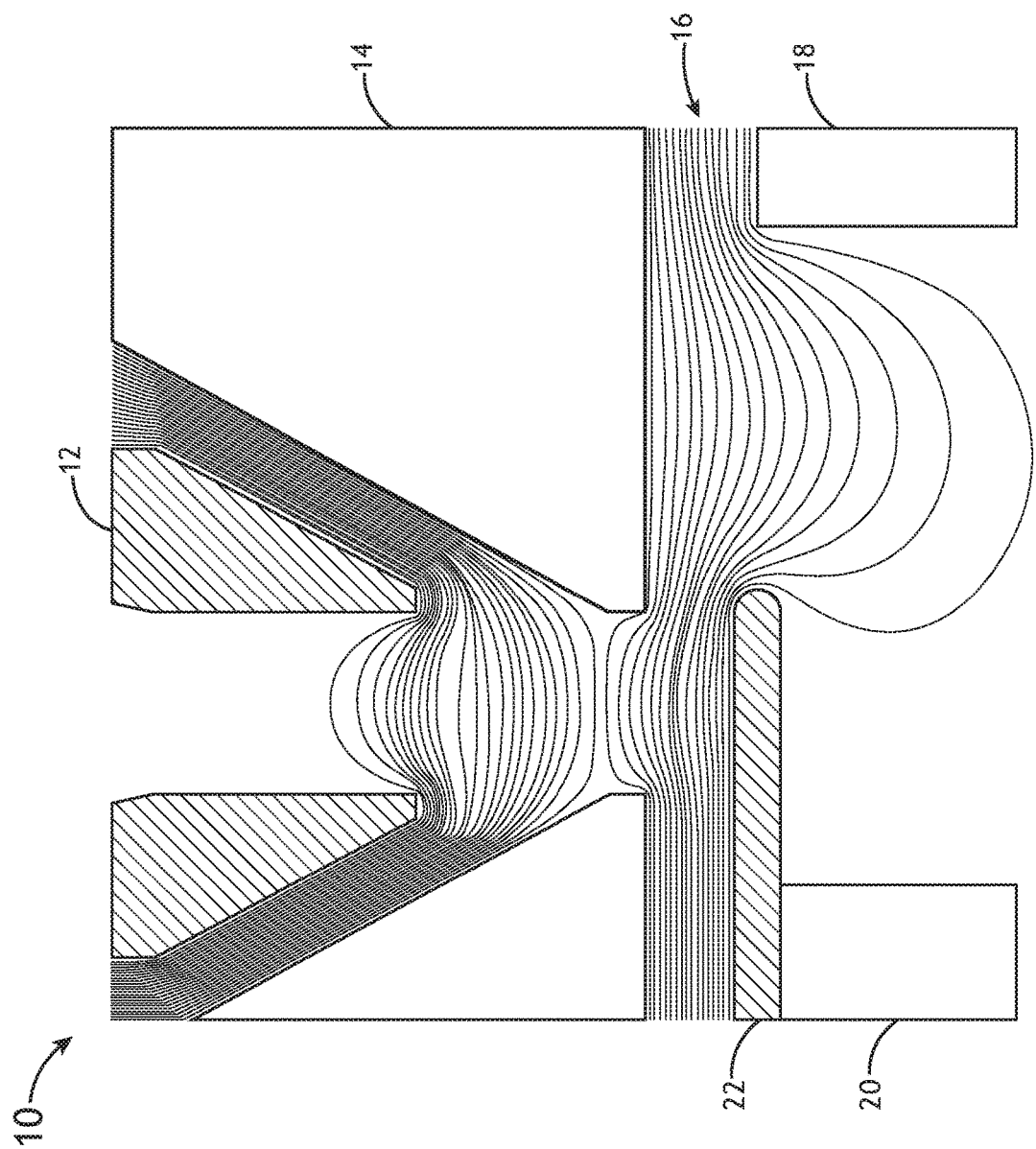
FIG. 1A illustrates a cross-sectional view of fringe fields associated with an electron-optical system and sample, in accordance with one or more embodiments of the present disclosure.

FIG. 1A illustrates a cross-sectional view of fringe fields associated with a portion 10 of an electron-optical system and sample, in accordance with one or more embodiments of the present disclosure. In electron-optical inspection and/or review systems, high resolution is achieved by employing an immersion-retarding objective lens 14, as shown in FIG. 1A. The sample 22 (e.g., wafer) may be placed very close to the objective lens pole piece system, such that the sample 22 is highly immersed in the magnetic fields of the objective lens 14. It is noted that an immersion objective lens 14 provides high resolution by reducing axial spherical aberration and chromatic aberration. On the other hand, the energy of the electrons traveling in between the emission source and objective lens is commonly set high (e.g., in 10-30 kV) in order to reduce the Coulomb interactions between electrons, which may degrade resolution. To protect the sample 22 from being damaged due to bombardment from high energy electrons, the landing energy (LE) of electrons to the sample 22 is set low (e.g., below 1 kV). Therefore, the electrostatic field near the sample 22 is a highly retarding field.

In a highly-retarding electron landing system, as in FIG. 1A, the potential difference between the ground electrode 12 and pole piece 14, or between the pole piece 14 and sample 22 may be large enough to meet the requirement of a given extraction field at low energy. At the edge of the sample (e.g., edge of the wafer), strong fringe fields are formed due to the retarding and asymmetric features, as shown in FIG. 1A. The fringe fields can be optically identified as a dipole field (E(z)), a quadrupole field (Q(z)), a hexapole field (H(z)) and an octupole field (O(z)), which are functions of the optical axis (z).

Figure 1B:
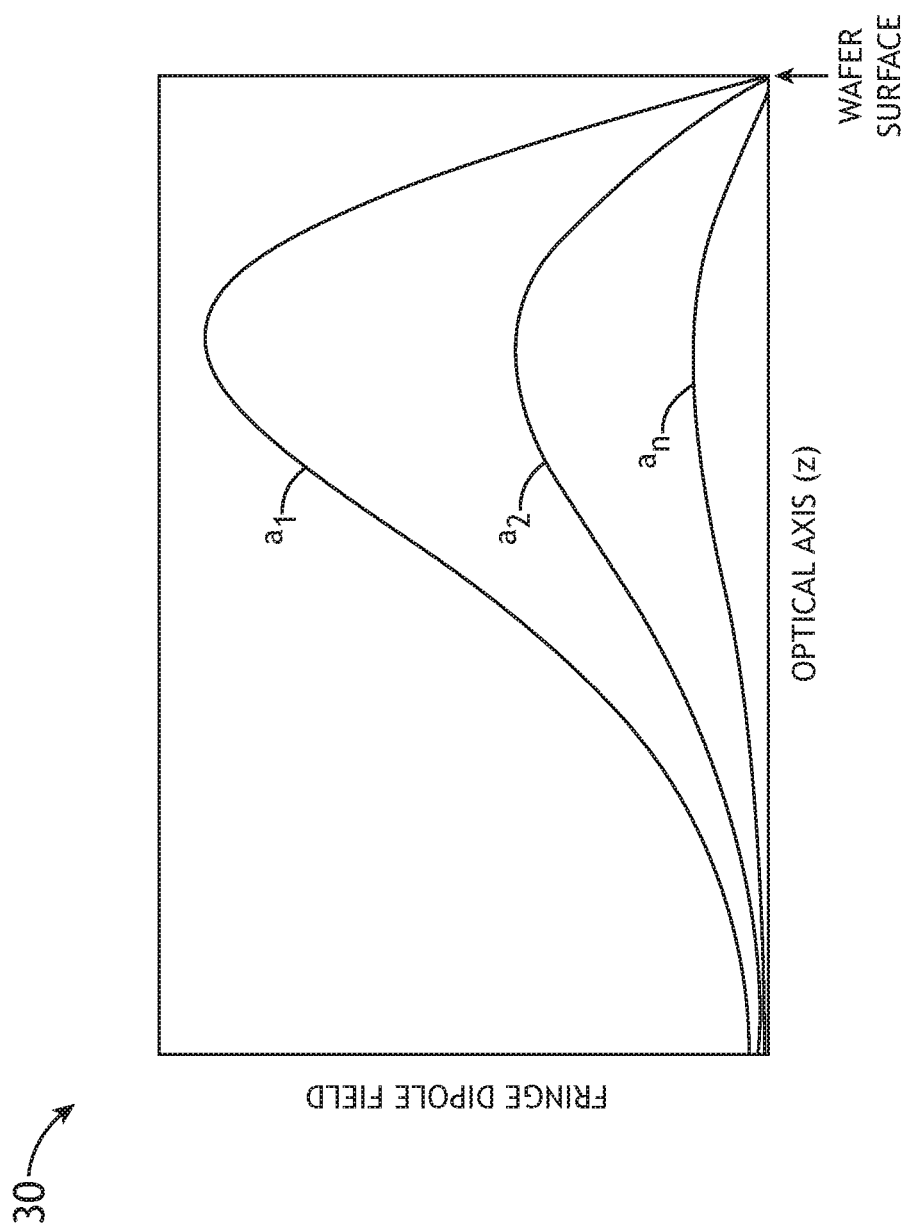
FIG. 1B illustrates the fringe dipole field as a function of position along the optical axis for a number of distances from the edge of the wafer, in accordance with one or more embodiments of the present disclosure.

FIG. 1B illustrates the fringe dipole field as a function of position along the optical axis for a number of distances from the edge of the wafer, in accordance with one or more embodiments of the present disclosure. As shown in FIG. 1B, the fringe dipole field, E(z), varies not only with the optical axis (z), but also with the edge distance a. Graph 30 depicts the fringe dipole field strength at a number of distances (in the X-Y plane) from the edge of the sample 112. In this example, $a_1 < a_2 < \ldots < a_n$, illustrating that fringe field increases closer to the edge of the sample. It is noted that the fringe quadrupole field, Q(z), has the same distribution as the fringe dipole field displays in FIG. 1B.

The fringe dipole field results in electron beam deflection blur and position error, characterized by the deflection coma, field curvature, off-axis astigmatism, transfer chromatic aberration and distortion, which represent off-axis degradation of performance. The fringe quadrupole field generates axial astigmatism, where axial astigmatism is normally much larger than off-axis astigmatism. Further, the hexapole and octupole fields generate blur as well, but are much less impactful than the dipole and quadrupole fields.

In the case of electron defect review (eDR), off-axis blur components and on-axis astigmatism caused by the dipole/quadrupole fields at the edge of the sample cause the image quality obtained by the system to be insufficient for identifying defects. In addition, the off-axis distortion results in beam positioning errors, which degrade the defect location accuracy of the system to the point that defects cannot be detected.

Figure 1C:
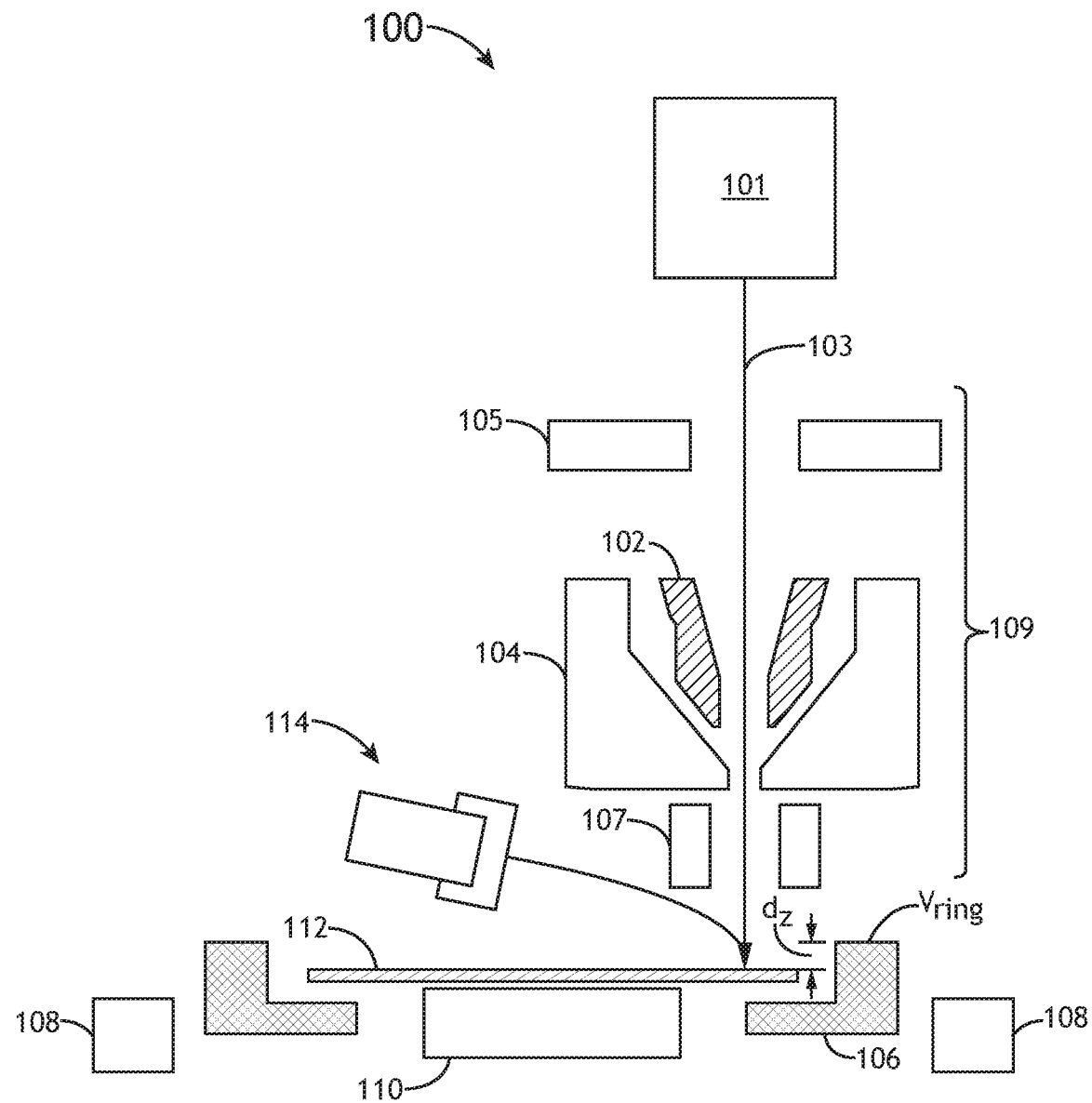
FIGS. 1C-1D illustrate a simplified schematic view of an electron-optical system for compensating for fringe fields at the edge of a sample, in accordance with one or more embodiments of the present disclosure.
Figure 1D:
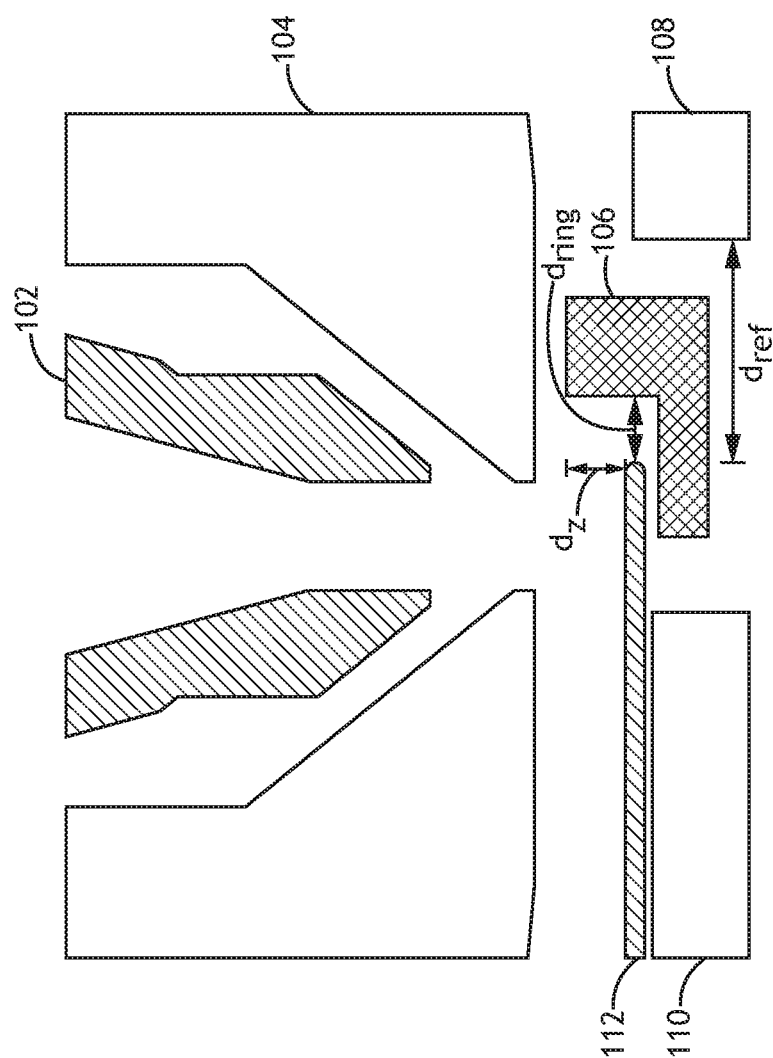

FIGS. 1C-1D illustrate a simplified schematic view of an electron-optical system for compensating for fringe fields at the edge of a sample, in accordance with one or more embodiments of the present disclosure. In one embodiment, the system 100 includes an electron beam source 101 for generating one or more electron beams 103. In another embodiment, the system 100 includes a sample stage 110 for securing the sample 112. In another embodiment, the system 100 includes an electron-optical column 109. In another embodiment, the system 100 includes a detector assembly 114 for detecting electrons emanating from the sample 112.

In one embodiment, the electron-optical column 109 may include a set of electron-optical elements for directing at least a portion of the one or more electron beams onto an edge portion of the sample 112. The set of electron-optical elements may include any electron-optical elements known in the art suitable for focusing, directing and/or conditioning the primary electron beam 103. For purposes of simplicity, a single electron-optical column is depicted in FIG. 1A. It is noted herein that this configuration should not be interpreted as a limitation on the present disclosure. For example, the system 100 may include multiple electron-optical columns. The set of electron-optical elements of the electron-optical column 109 may direct at least a portion of the primary electron beam 103 onto a selected portion of the sample 112.

In one embodiment, the electron-optical column 109 includes one or more electron-optical lenses, such as, but not limited to, one or more magnetic lenses or more electrostatic lenses. For example, the one or more electron-optical lenses may include, but are not limited to, one or more condenser lenses 105 for collecting electrons from the electron beam source 101. By way of another example, the electron-optical lenses may include, but are not limited to, one or more objective lenses 104 for focusing the primary electron beam 103 onto a selected region of the sample 112. For instance, the one or more objective lenses 104 may include an objective lens pole piece.

In one embodiment, the electron-optical column 109 includes a column ground device 102. For example, the column ground device 102 may include a ground electrode, which is at least partially surrounded by the objective lens 104 pole piece. It is further noted that a large potential difference may be established between the ground device 102 and the objective lens pole piece (as well as between the pole piece and the sample 112), as noted previously herein.

In another embodiment, the set of electron-optical elements of the electron-optical column 109 includes one or more electron beam scanning elements 107. For example, the one or more electron beam scanning elements 107 may include, but are not limited to, one or more electromagnetic scanning coils or electrostatic deflectors suitable for controlling a position of the beam 103 relative to the surface of the sample 112. In this regard, the one or more scanning elements 107 may be utilized to scan the electron beam 103 across the sample 112 in a selected pattern.

The electron beam source 101 may include any electron source known in the art. For example, the electron beam source 101 may include, but is not limited to, one or more electron guns. For instance, the electron beam source 101 may include a single electron gun for generating a single electron beam 103. In another instance, the electron beam source 101 may include multiple electron guns for generating multiple electron beams 103.

The sample stage 110 may include any type of sample stage known in the art of inspection/review suitable for securing a sample. The sample 112 may include any sample suitable for inspection/review with electron-beam microscopy, such as, but not limited to, a substrate. The substrate may include, but is not limited to, a wafer, such as a silicon wafer. In another embodiment, the sample stage 110 is an actuatable stage. For example, the sample stage 110 may include, but is not limited to, one or more translational stages suitable for selectively translating the sample 112 along one or more linear directions (e.g., x-direction, y-direction and/or z-direction). By way of another example, the sample stage 110 may include, but is not limited to, one or more rotational stages suitable for selectively rotating the sample 112 along a rotational direction. By way of another example, the sample stage 110 may include, but is not limited to, a rotational stage and a translational stage suitable for selectively translating the sample along a linear direction and/or rotating the sample 112 along a rotational direction. It is noted herein that the system 100 may operate in any scanning mode known in the art. For example, the system 100 may operate in a swathing mode when scanning the primary electron beam 103 across the surface of the sample 112. In this regard, the system 100 may scan the primary electron beam 103 across the sample 112, while the sample is moving, with the direction of scanning being nominally perpendicular to the direction of the sample motion. By way of another example, the system 100 may operate in a step-and-scan mode when scanning the primary electron beam 103 across the surface of the sample 112. In this regard, the system 100 may scan the primary electron beam 103 across the sample 112, which is nominally stationary when the beam 103 is being scanned.

The detector assembly 114 may include any detector assembly or detector known in the art of electron-based inspection and/or review. For example, the detector assembly 114 may include any in-column or out-of-column detector assembly suitable for detecting secondary electrons and/or backscattered electrons from the sample 112. In one embodiment, as shown in FIG. 1A, secondary electrons may be collected and imaged using an out-of-column Everhart-Thornley detector (or other type of scintillator-based detector). In another embodiment, electrons may be collected and imaged using an in-column micro-channel plate detector (not shown). In another embodiment, electrons may be collected and imaged using a PIN or p-n junction detector, such as a diode or a diode array. In another embodiment, electrons may be collected and imaged using one or more avalanche photo diodes (APDs).

In another embodiment, the system 100 includes a sample position reference device 108 disposed about the sample 112. For example, as shown in FIGS. 1C and 1D, a mirrored plate may be disposed outside of the edge portion of the sample 112, so as to provide a reference surface for measuring the location of the sample 112. For instance, the reference device 108 may include, but is not limited to, a mirrored ring plate 108 that surrounds the edge of the sample 112, whereby a distance between the edge of the sample 112 and the mirrored ring plate is given by some sample-reference distance, $d_{ref}$, as shown in FIG. 1D.

In another embodiment, the system 100 includes a guard ring device 106 disposed between the edge of the sample 112 and the sample position reference device 108 to compensate for one or more fringe fields. In another embodiment, one or more characteristics of the guard ring device 106 are adjustable. For example, as discussed in greater detail further herein, the height (e.g., position along the optical axis) and/or the voltage of the guard ring device 106 may be adjusted so as to compensate for the effects of the one or more fringe fields (e.g., field lines shown in FIG. 1A). In this regard, the adjustment of the height and/or voltage of the guard ring device 106 may act to re-distribute and reduce the one or more fringe fields. The reduction in the one or more fringe fields acts to correct one or more effects otherwise caused by the one or more fringe fields, such as, but not limited to, beam position offset error, defocus and astigmatism.

In one embodiment, the guard ring device 106 is a conductive ring structure that surrounds the edge of the sample 112. For example, the guard ring device 106 may include, but is not limited to, the stepped structure shown in FIG. 1D. The scope of the present disclosure is not limited to the structure depicted in FIG. 1D, which is provided merely for illustrative purposes. It is recognized herein that any guard device may be implemented in the context of system 100. For instance, the guard ring device 106 may include no steps or may include three or more steps. Further, the guard ring device 106 may include a single ring structure or may include multiple ring structures combined to form a desired step structure. Further, the guard ring device 106 is not limited to the flat stepped structure shown in FIG. 1D. For instance, the guard ring device 106 may include an edge of any geometrical shape, such as, but not limited to, a rounded edge. Such a rounded surface may serve to optimize compensation of the one or more fringe fields.

Figure 1E:
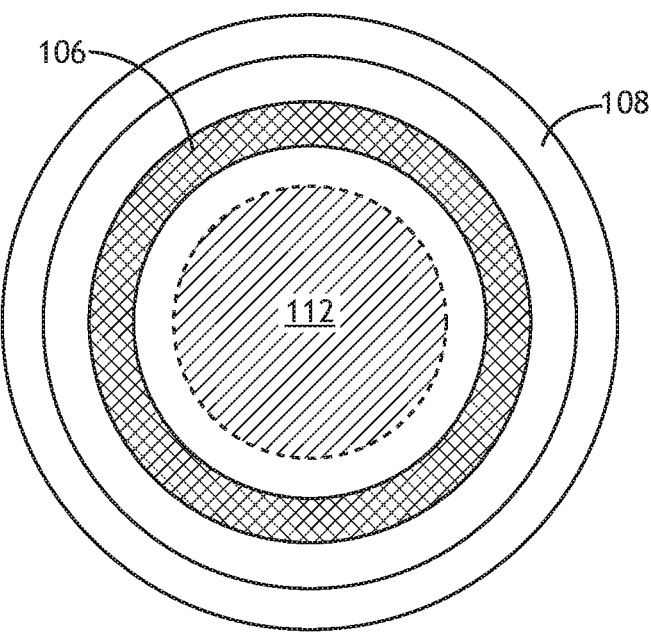
FIGS. 1E-1F illustrate top views of a guard ring device, in accordance with one or more embodiments of the present disclosure.
Figure 1F:
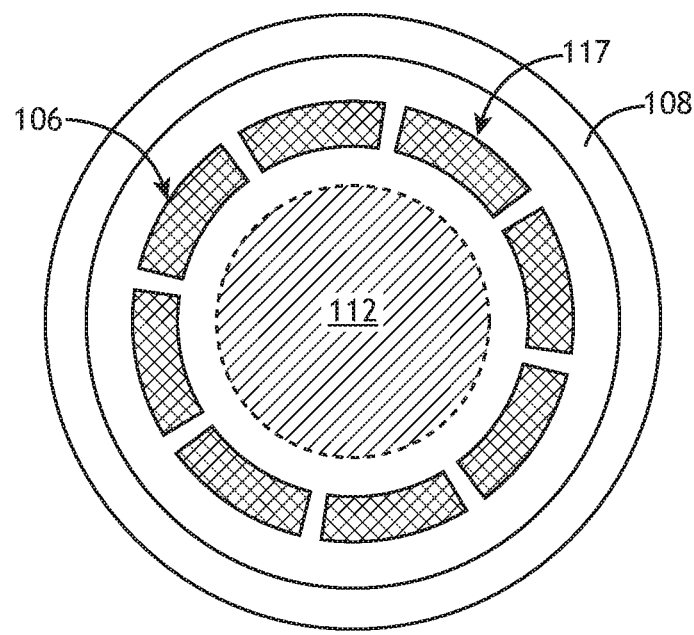

In one embodiment, as shown in FIG. 1E, the guard ring device 106 includes a continuous ring structure that surrounds the sample 112. In another embodiment, as shown in FIG. 1F, the guard ring device 106 includes a set of sub-structures 117 that together form a generally circular structure that surrounds the sample 112. It is noted that the use of multiple closely spaced sub-structures 117 may allow for the adjustment of the gap distance between the edge of the sample 112 and the guard ring device, noted as $d_{ring}$ in FIG. 1D. In another embodiment, although not shown, the guard ring device 106 may be formed so to have a grid or mesh structure.

It is noted that the guard ring device 106 may be formed from any selected material. In the case where the guard ring device 106 is conductive, the guard ring device 106 may be formed from any conductive material or materials known in the art. For example, the guard ring device 106 may be formed from one or more metals or metal alloys. For instance, the guard ring device 106 may be formed from, but is not limited to, gold, copper, silver, aluminum, stainless steel, brass and the like. By way of another example, the guard ring device 106 may be formed from one or more non-metal materials coated in one or more metals or metal alloys.

Figure 1G:
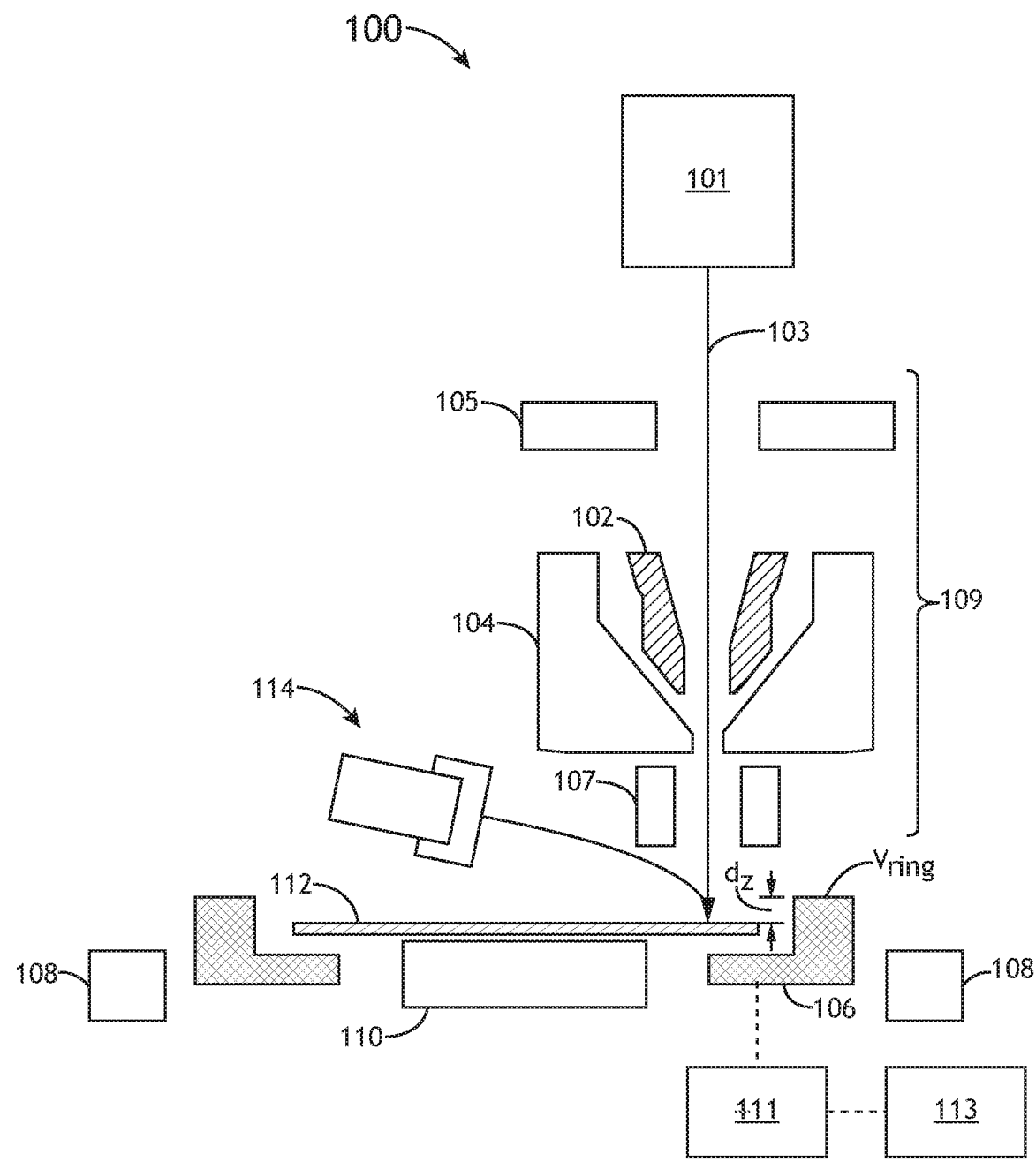
FIG. 1G illustrates a simplified schematic view of an electron-optical system for compensating for fringe fields at the edge of a sample using a height-adjustable guard ring device, in accordance with one or more embodiments of the present disclosure.

FIG. 1G illustrates a simplified schematic view of the electron-optical system 100 equipped with a height-adjustable guard ring device 106 for compensating for fringe fields at the edge of a sample, in accordance with one or more embodiments of the present disclosure. As shown in FIG. 1G, the guard ring device 106 compensates for fringe fields at the edge of the sample 112 via the adjustment of the height of the guard ring device 106 along the optical axis of the system 100.

In one embodiment, the system 100 includes one or more actuator devices 111 mechanically coupled to the guard ring device 106. Further, the system 100 may include a controller 113 communicatively coupled to the actuator device 111 and configured to direct the actuator device 111 to control a position of the guard ring device 106. For example, the controller 113 may direct the actuator device 111 to adjust the position of the guard ring device 106 along the optical axis. In this regard, the system 100 may control the height $d_z$ of the guard ring device 106 relative to the sample 112.

It is noted that positioning the guard ring device 106 within the region between the sample 112 and the sample reference 108 of the highly-retarding and asymmetric system 100 may significantly reduce and/or redistribute the one or more fringe fields at or near the edge of the sample 112. The reduction and/or redistribution of the one or more fringe fields acts to correct one or more effects otherwise caused by the one or more fringe fields, such as, but not limited to, beam position offset error, defocus and astigmatism.

It is noted that the deflection distance (D) of the electron beam 103 caused by fringe fields may be compensated and the off-axis blur components and distortion may be corrected. It is noted that the various blur components and distortion have different dependencies on deflection distance. For example, the off-axis coma blur and transfer chromatic blur are related linearly to D, the field curvature and the astigmatism is related to $D^2$ and the distortion is related to $D^3$.

Figure 1H:
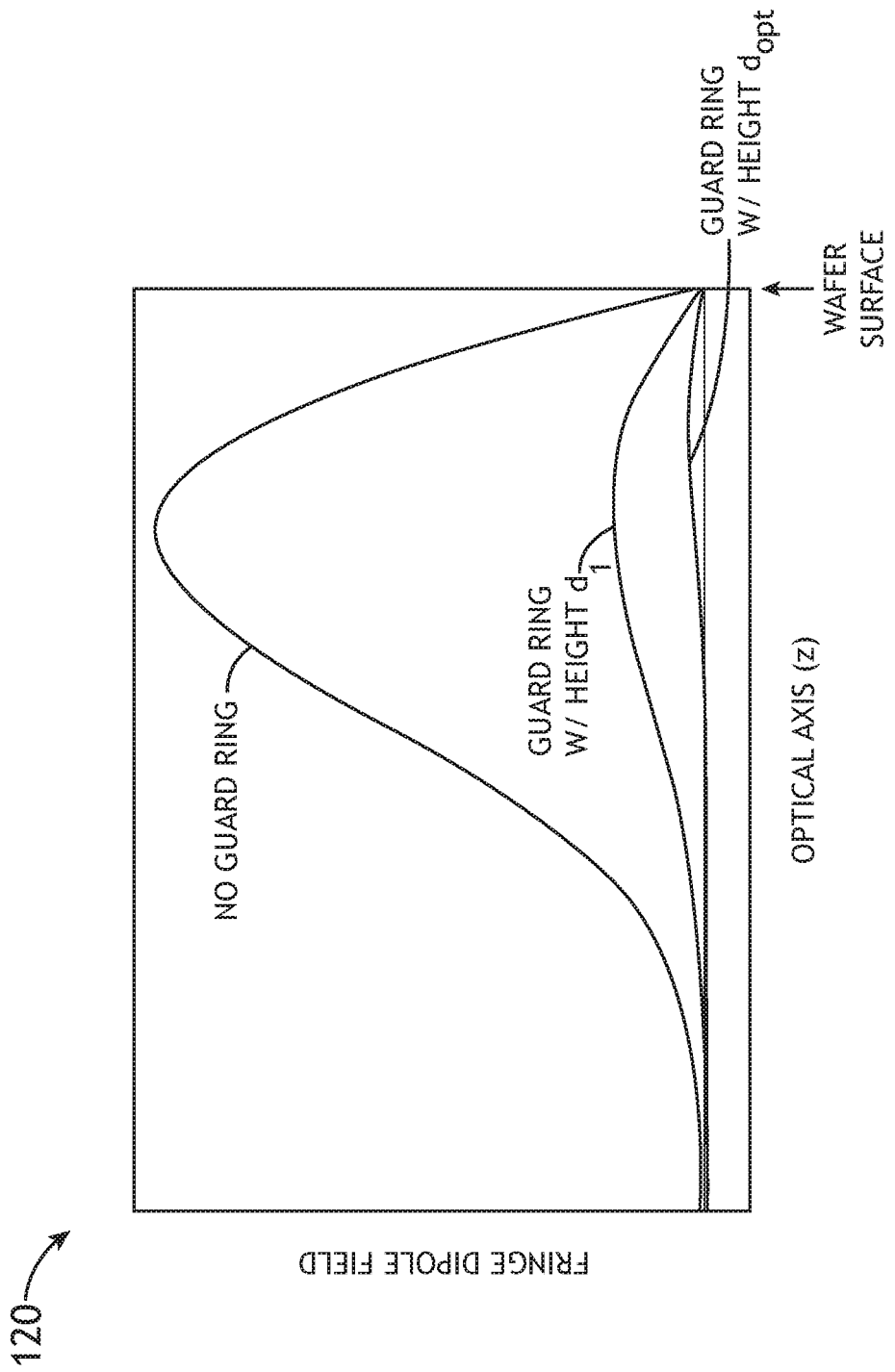
Figure 11:
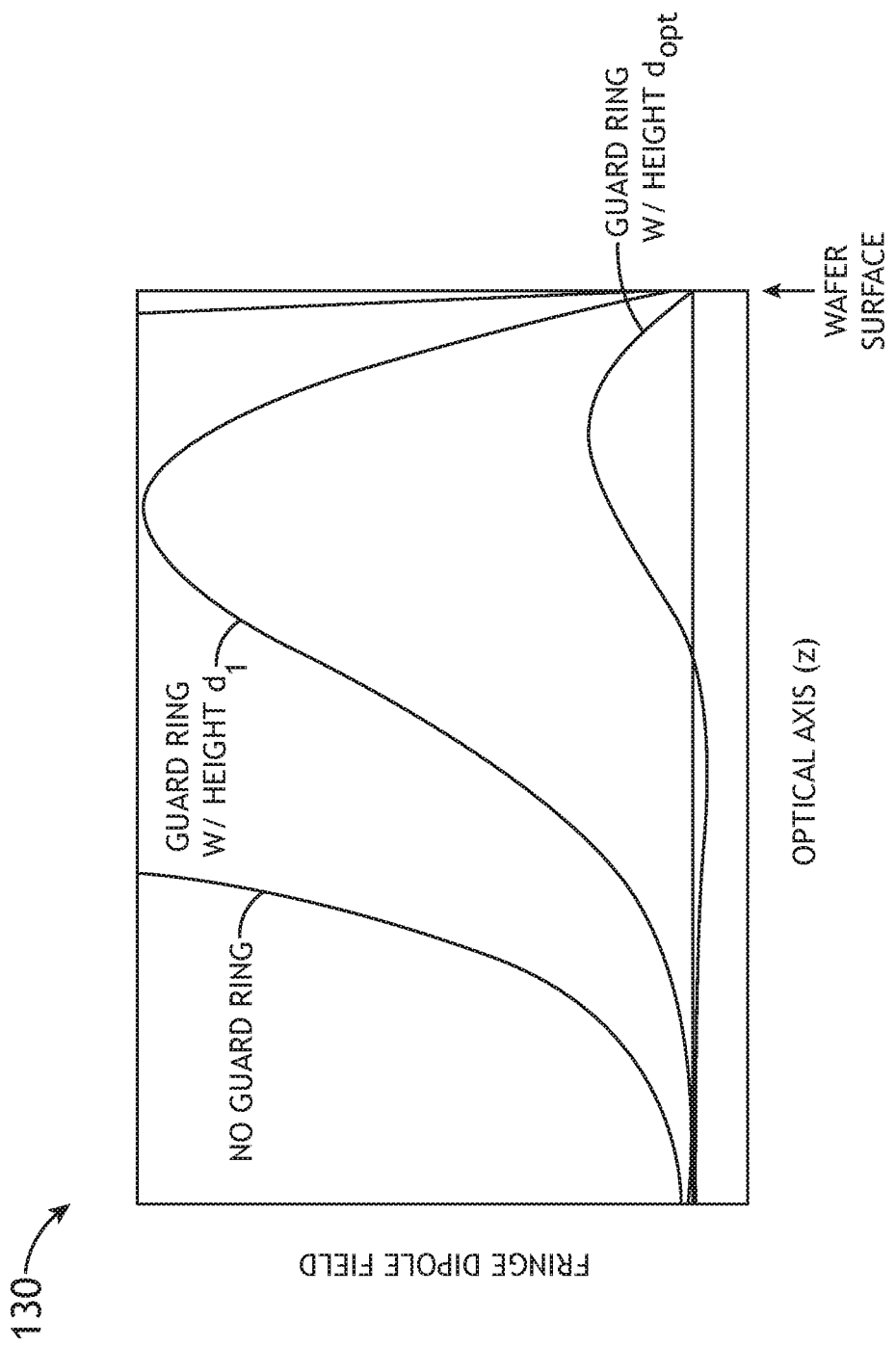

FIGS. 1H-1I illustrate graphs of the fringe dipole field as a function of position along the optical axis (i.e., z-axis) for a variety of use cases, in accordance with one or more embodiments of the present disclosure. For example, graph 120 depicts the control case where no guard ring is present in the system 100. In this case, the dipole field strength is at its maximum. The introduction of the guard ring device 106 at a height $d_z$ of $d_1$ represents an improved (but non-optimal) positioning of the guard ring device 106 relative to the case with no guard ring present. Further, an optimal height $d_{opt}$ may be achieved. The optimal height is interpreted as the height that leads to the minimization of one or more fringe fields (e.g., fringe dipole field) at a selected location within the system (e.g., at a selected position along the z-axis). During fringe field compensation, one or more fringe fields may be re-distributed and varied, negatively to positively, such that the deflection at the sample 112 is eliminated (or at least reduced). The scenario where the dipole fringe field is varied from negative to positive is shown in the curve associated with the optimal height $d_{opt}$ in FIG. 1I. In addition, the axial astigmatism due to the fringe quadrupole field may be greatly minimized (to the point of negligibility) because the amplitude of the quadrupole field Q(z) is largely reduced.

It is noted that the height $d_z$ of the guard ring device 106 may be adjusted until the optimal height $d_{opt}$ is achieved. In this regard, the controller 113 may adjust the height of the guard ring device 106 until the one or more fringe fields are minimized or reduced below a selected tolerance level. Alternatively, the preferred height of the guard ring device 106 may be calculated or measured in advance of operation of system 100 and the guard ring device 106 may be placed at this location prior to operation of the system 100.

Figure 1J:
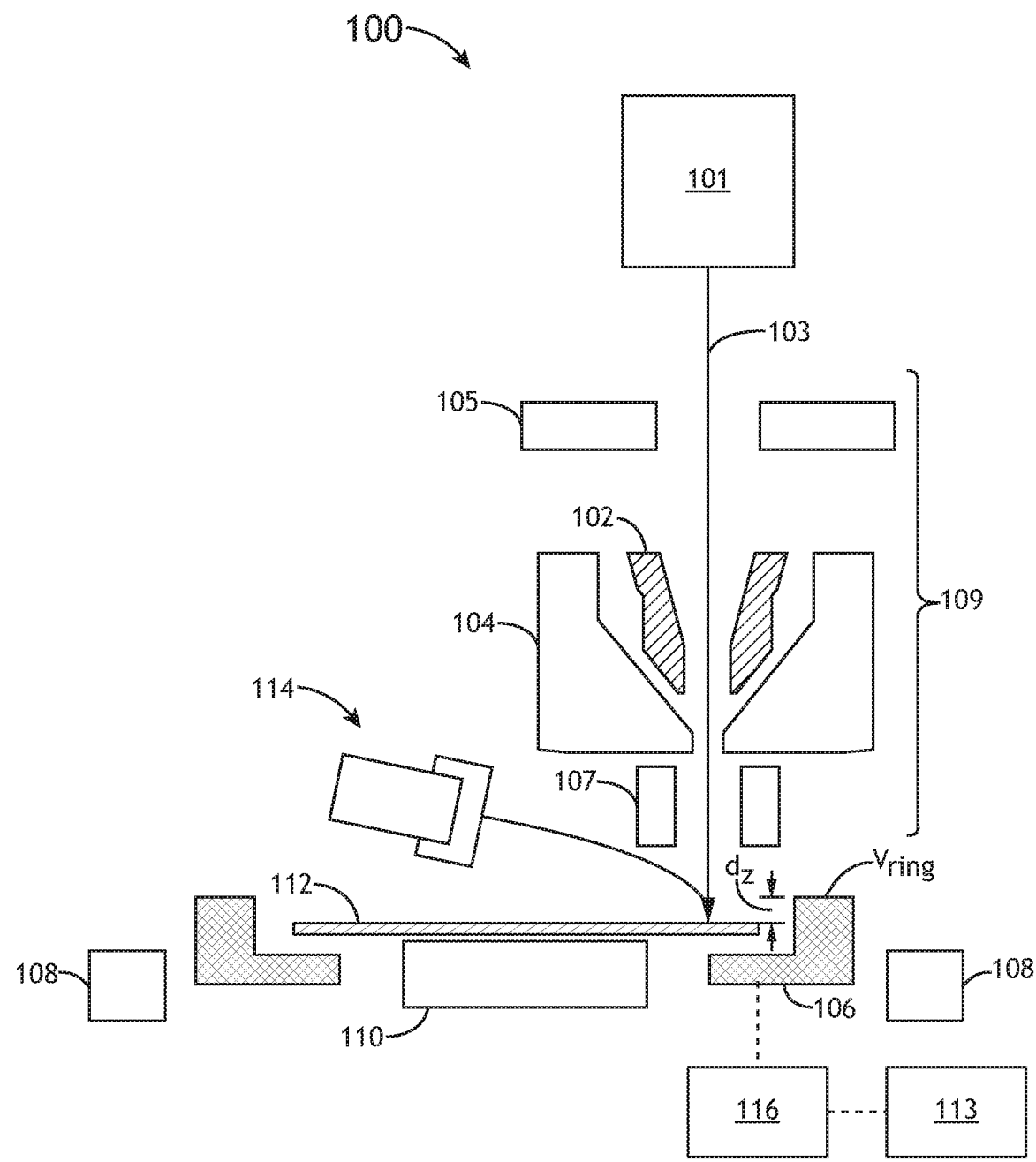
FIG. 1J illustrates a simplified schematic view of an electron-optical system for compensating for fringe fields at the edge of a sample using a voltage-adjustable guard ring device, in accordance with one or more embodiments of the present disclosure.

FIG. 1J illustrates a simplified schematic view of the electron-optical system 100 equipped with a voltage-adjustable guard ring device 106 for compensating for fringe fields at the edge of a sample, in accordance with one or more embodiments of the present disclosure. As shown in FIG. 1J, the guard ring device 106 compensates for fringe fields at the edge of the sample via the adjustment of the voltage of the guard ring device 106.

In one embodiment, the system 100 includes voltage control circuitry 116 electrically coupled to the guard ring device 106. Further, the controller 113 may be communicatively coupled to the voltage control circuitry 116 and configured to direct the voltage control circuitry 116 to apply a selected voltage $V_{ring}$ to the guard ring device 106. It is noted that the application of $V_{ring}$ to the guard ring device 106 may serve to redistribute the fringe fields along the z-axis.

Given an operational scenario characterized by the beam energy, the beam landing energy and the extraction field on the surface of the sample, it is noted that guard ring voltage $V_{ring}$ may be adjusted so as to redistribute and/or reduce the fringe fields to a desired level. It is further noted that an optimal voltage may be achieved $V_{ring\text{-}opt}$ whereby the impact of the fringe fields are minimized and the fringe fields are varied from negative to positive in a manner similar to guard ring device height adjustment described previously herein.

It is noted that the voltage $V_{ring}$ on the guard ring device 106 may be adjusted until the optimal voltage $V_{ring\text{-}opt}$ is achieved. In this regard, the controller 113 may adjust the voltage on the guard ring device 106 until the one or more fringe fields are minimized or reduced below a selected tolerance level. Alternatively, the preferred voltage of the guard ring device 106 may be calculated or measured in advance of operation of system 100 and the guard ring device 106 may be energized to this voltage prior to operation of the system 100.

Figure 1K:
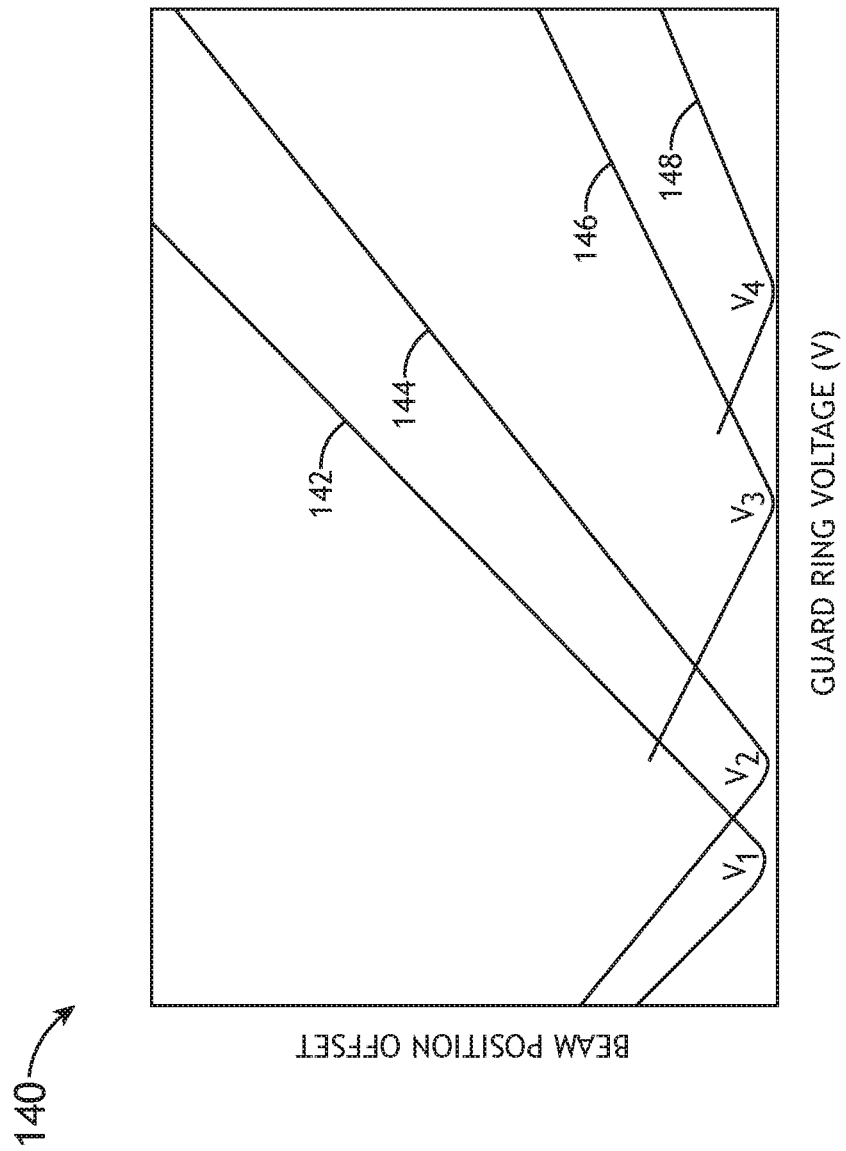
FIGS. 1K-1L illustrate graphs of beam position offset and astigmatism as a function of guard ring device voltage for a variety of use cases, in accordance with one or more embodiments of the present disclosure.
Figure 1L:
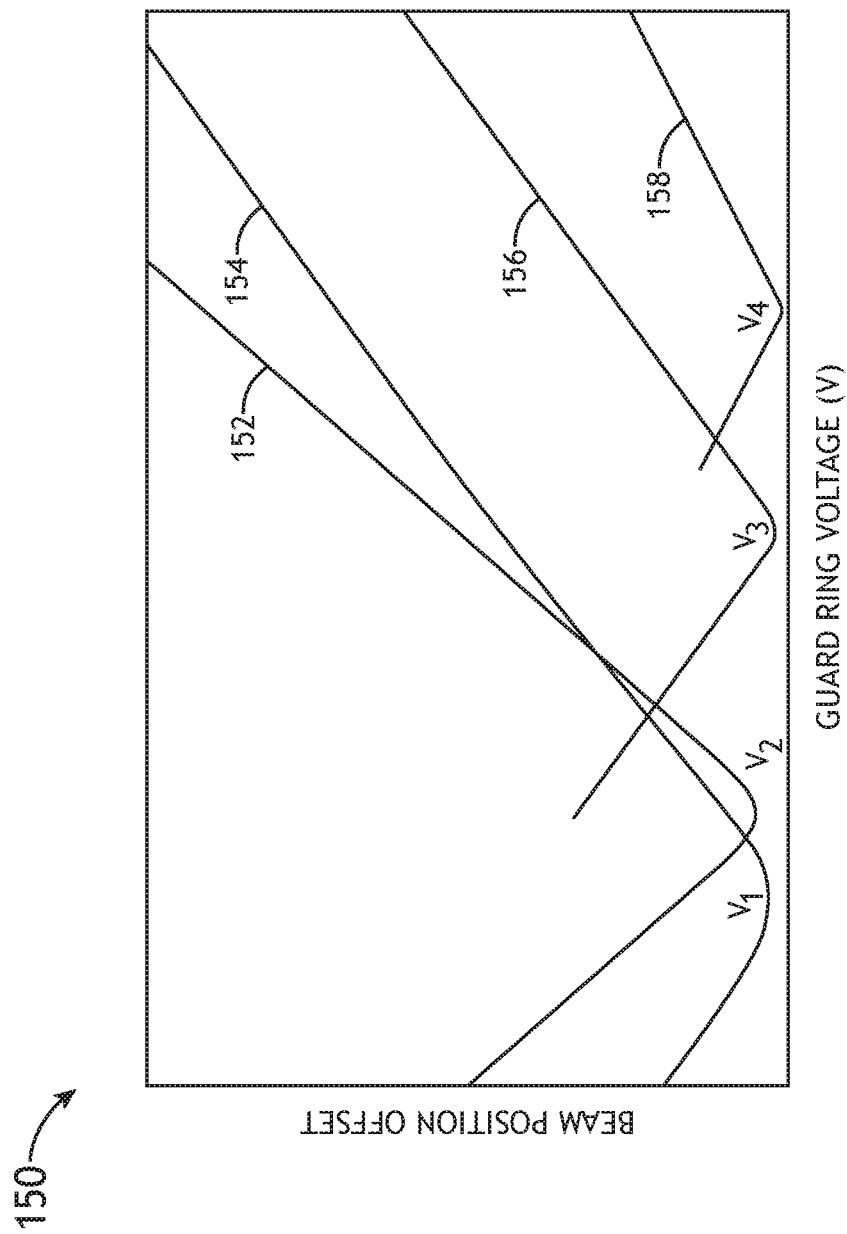

FIGS. 1K-1L illustrate graphs of beam position offset 140 and axial astigmatism 150 as a function of guard ring device voltage for a variety of use cases, in accordance with one or more embodiments of the present disclosure. FIG. 1K illustrates four use cases represented by curves 142, 144, 146 and 148 in which beam position offset is measured as a function of guard ring voltage $V_{ring}$. In the case of beam position offset measurement, the optimal $V_{ring}$ values for the use cases correspond to voltages V1, V2, V3 and V4, respectively. In this regard, beam off-axis blur, beam axial astigmatism and beam position offset can all be minimized at the optimal guard-ring voltages. Note that the optimal voltages V1, V2, V3 and V4 for correcting the beam position offsets are the same as those needed for correcting/minimizing the axial astigmatism in the four use cases, corresponding to curves 152, 154, 156 and 158, as shown in FIG. 1L.

It is noted that while FIGS. 1G-1L have represented the adjustment of guard ring device height and voltage separately for purposes of clarity this is not a limitation on the scope of the present disclosure. Rather, it is recognized herein that system 100 may act to redistribute the fringe fields (from negative to positive) and compensate for the fringe fields by adjusting both the height of the guard ring device 106 and the voltage on the guard ring device 106. In this regard, the system 100 may compensate the fringe fields by first setting a height of the guard ring device 106 and then finding the optimal voltage for the given height. Alternatively, the system 100 may compensate the fringe fields by first setting a voltage of the guard ring device 106 and then finding the optimal height for the given voltage. In this regard, the effects of the one or more fringe fields, such as, but not limited to, beam position offset, defocus and astigmatism may be corrected (or at least reduced). Further, the simultaneous adjustment of height and voltage aids in reducing the risk of improper voltages and/or improper height of the guard ring device 106, allowing more flexibility to across the various use cases of the system 100, which may include large variations in parameters such as, but not limited to, beam energy, landing energy and extraction field. For instance, to reduce the necessary voltage to achieve the optimal voltage $V_{ring\text{-}opt}$ and avoid risk of arcing, the guard ring device may be adjusted to a selected height at which the guard ring device voltage is applied with a narrowed potential difference between the neighboring electrodes.

Figure 2A:
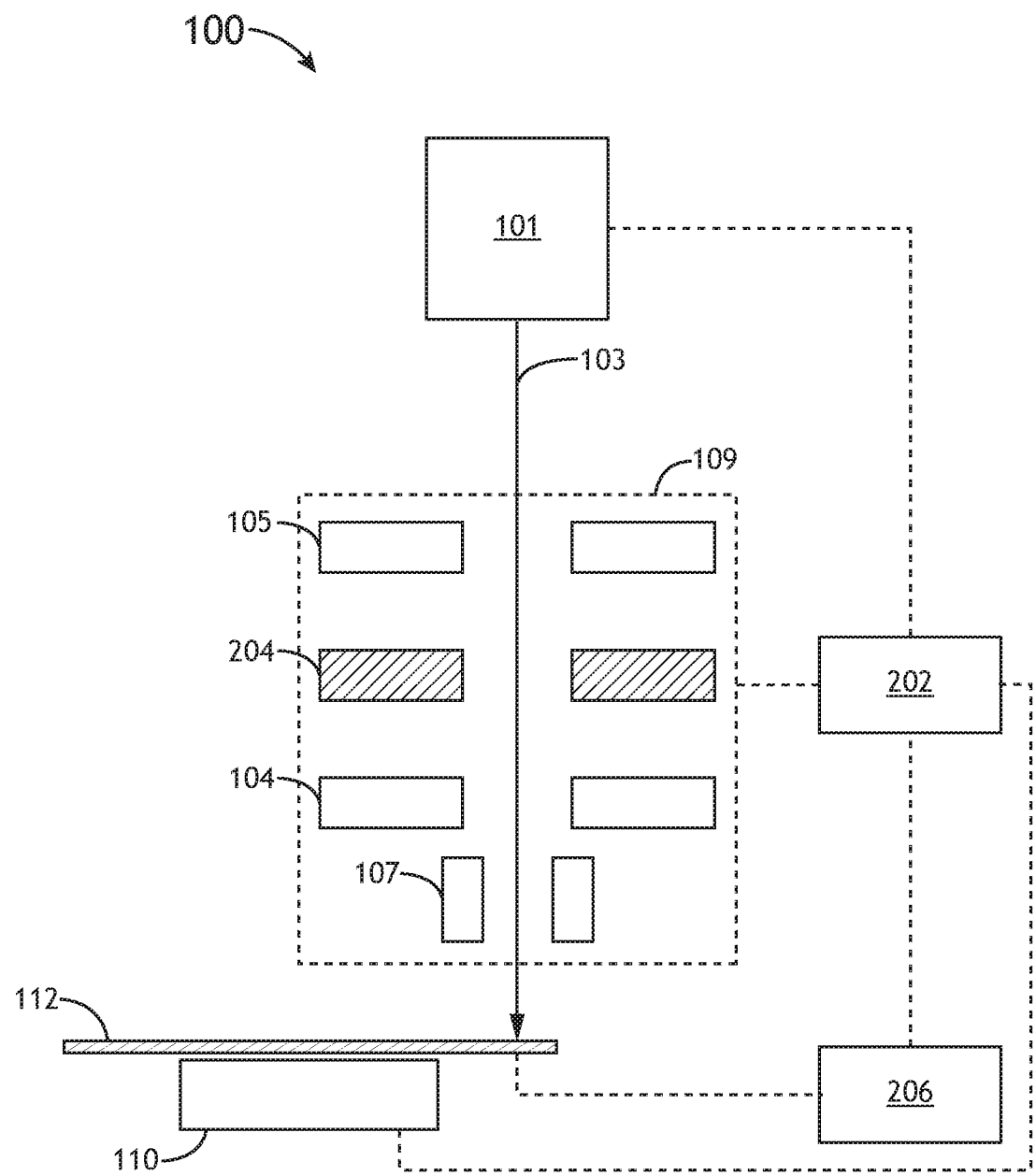
FIG. 2A illustrates a simplified schematic view of a system for compensating for fringe fields at the edge of a sample utilizing a look-up table, in accordance with one or more embodiments of the present disclosure.

FIG. 2A illustrates a simplified schematic view of the system 100 for compensating for fringe fields at the edge of a sample utilizing a look-up table, in accordance with one or more embodiments of the present disclosure. In one embodiment, the system 100 includes a controller 202 for generating a look-up table for compensating for one or more fringe fields within the electron-optical system 100. In this embodiment, the controller 202 may direct one or more portions of the electron-optical system 100 to correct the optical effects resulting from one or more fringe fields using the look-up table generated by the controller 202.

For example, the look-up table may be implemented to correct for positioning errors in the electron beam 103; defocus in the electron beam; astigmatism in the electron beam; and/or fringe field effects across the entire wafer (polar angle varies from θ=0 to 360 degrees). In one embodiment, the controller 202 is communicatively coupled to the electron source 101, one or more portions of the electron-optical column 109, the stage 110 and/or voltage control circuitry 206. For example, the controller 202 may be communicatively coupled to and configured to control one or more focusing elements (e.g., lens) to correct defocus of the electron beam 103. By way of another example, the controller 202 may be communicatively coupled to and configured to control voltage control circuitry 206 in electrical communication with the sample. For instance, the controller 202 may control the voltage control circuitry to adjust the bias on the sample 112 to compensate for defocus in the electron beam 103. By way of another example, the controller 202 may be communicatively coupled to and configured to control a stigmator 204 of the electron-optical column 109 to compensate for axial astigmatism in the electron beam 103. By way of another example, the controller 202 is communicatively coupled to the sample stage 110 and may carry out a coordinate or movement correction to compensate for position offset caused by one or more fringe fields. By way of another example, the controller 202 is communicatively coupled to and configured to control the electron source 101 to compensate for position offset caused by the one or more fringe fields.

Figure 2B:
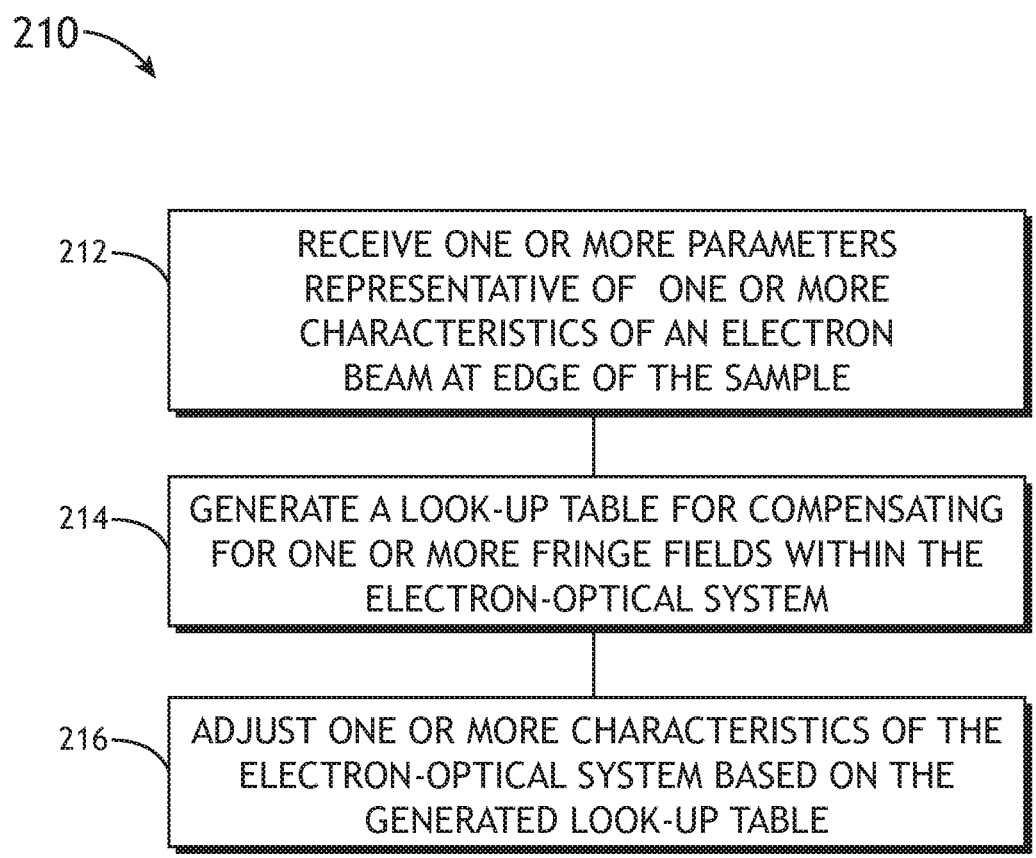
FIG. 2B illustrates a process flow diagram of a method of compensating for fringe fields at the edge of a sample utilizing a look-up table, in accordance with one or more embodiments of the present disclosure.

FIG. 2B illustrates a method 210 of compensating for fringe fields at the edge of a sample utilizing a look-up table, in accordance with one or more embodiments of the present disclosure. In step 212, one or more parameters representative of one or more characteristics of the one or more electron beams at an edge portion of the sample are received. In step 214, a look-up table for compensating for one or more fringe fields within the electron-optical system is generated. In step 216, one or more characteristics of the electron-optical system are adjusted based on the generated look-up table.

For example, a user or another system may input information related to a selected use case associated with a particular inspection and/or review measurement process. Based on this information (e.g., geometry of sample and electron-optical system, beam parameters and the like), the controller 202 may generate a look-up table for compensating one or more fringe fields within the electron-optical system 100. In turn, the controller 202 may adjust the one or more characteristics of the electron-optical system 100 based on the generated look-up table. Details related to the generation of the look-up table and the adjustment of one or more portions of the electron-optical system are described further herein.

It is recognized herein that the one or more fringe fields, such as the dipole field and/or the quadrupole field, behave exponentially and that the optical effects (e.g., electron beam position offset by dipole field deflection, defocus by the field curvature, and astigmatism by the quadrupole field) associated with these fields also behave exponentially.

By way of example, the fringe dipole field, E(z,a) (see FIG. 1B) obeys an exponential law with respect to the edge of sample distance, a, as follows $$\int E(z,a)dz = P^*\exp(T^*a) \quad (1)$$

where P and T are constants. The integration of E(z,a) over the z-axis represents the total deflection strength at the edge distance a. Similarly, the fringe quadrupole field, Q(z,a) obeys an exponential relationship as well:

$$\int Q(z,a)dz = P^*\exp(T^*a) \quad (2)$$

where the integration of Q(z,a) over the z-axis represents the total astigmatic strength at the edge distance a.

The fringe dipole field, E(z,a), generates one or more off-axis blur components (e.g., coma, field curvature, astigmatism, transfer chromatic aberration) and distortion (e.g., beam positioning offset errors). Further, the fringe quadrupole field, Q(z,a), generates axial astigmatism. It has been observed that all of these fringe effects also display exponential behavior as follows:

$$[\text{off-axis blurs, distortion, axial astigmatism}] = P^*\exp(T^*a) \quad (3)$$

It has been observed that of the fringe field effects that occur at the edge of the sample 112, distortion and field curvature caused by the dipole fringe field and axial astigmatism by the fringe quadrupole field are of most importance. In the case of electron beam defect review, distortion causes beam positioning errors and degrades the defect location accuracy, while field curvature and axial astigmatism degrade image quality.

Figure 2C:
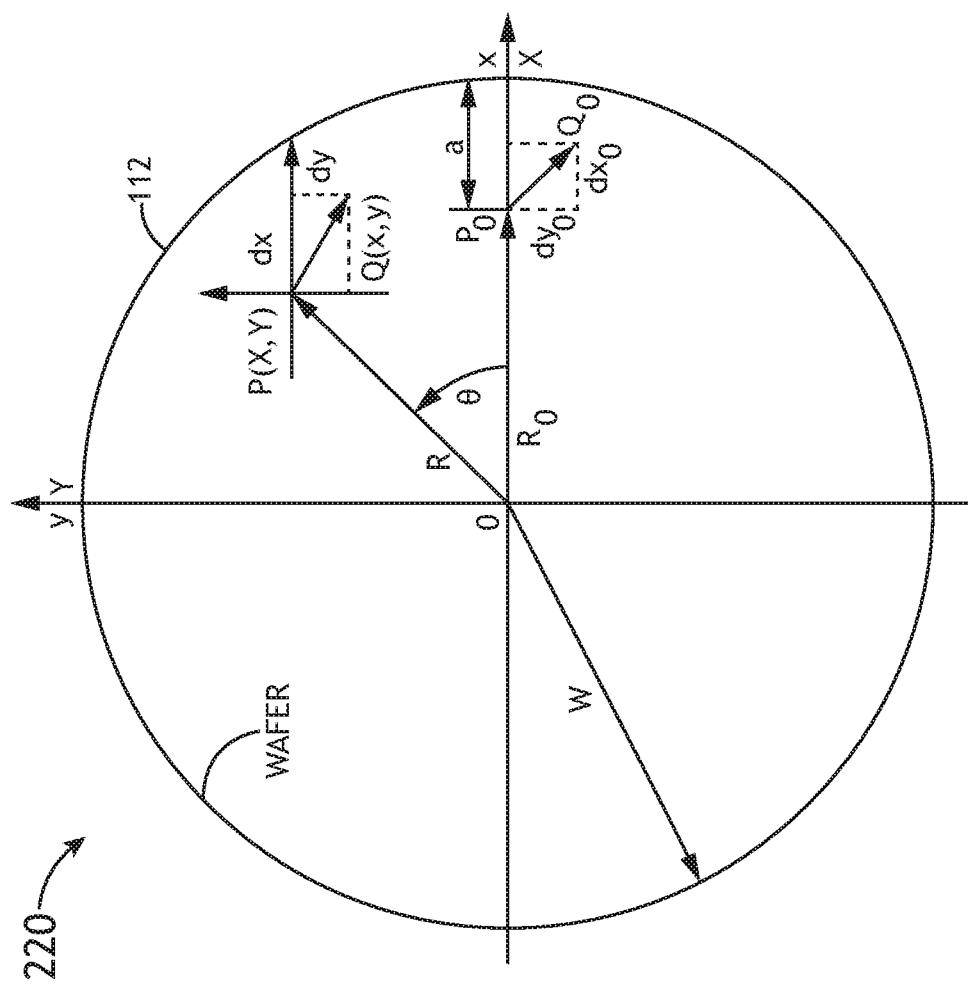
FIG. 2C illustrates a conceptual view of the coordinate system used when compensating for fringe fields at the edge of a sample utilizing a look-up table, in accordance with one or more embodiments of the present disclosure.

FIG. 2C illustrates a conceptual view 220 of the coordinate system used when compensating for fringe fields at the edge of a sample utilizing the look-up table, in accordance with one or more embodiments of the present disclosure.

The X-Y coordinate system represents an idealized reference frame, where the performance of electron-optical system 100 is not influenced by the fringe fields. The x-y coordinate system represents the real reference frame, in which all electron-optical system is impacted by the one or more fringe fields. For example, in the event the electron beam 103 is to be moved to the ideal position P(X,Y), it is actually moved to the real position Q(x,y) due to the deflection by the fringe dipole field. As a result, there exist electron beam position offsets of (dx, dy) due to the deflection distortion, the electron beam defocus distance of dz due to the field curvature effect, and the astigmatism blur of $d_{stig}$ due to the fringe quadrupole field. It is noted again that all of these fringe field effects obey the exponential law:

$$\lfloor(dx,dy),dz,d_{stig}\rfloor = P^*\exp(-T^*a) = P^*\exp[-T^*(W-R)] \quad (4)$$

The coefficients (P,T) are a function of use conditions of the electron-optical system include, but are not limited to, beam energy (BE), electron beam landing energy (LE) and extraction field (ExF) on the surface of the sample. This relationship is expressed as follows:

$$(P,T) = f(BE,LE,xF) \quad (5)$$

In one embodiment, the controller 202 generates (e.g., generates via computer simulation) the look-up table of (P,T) values and then the controller 202 corrects the fringe field effects of [(dx,dy),dz, $d_{stig}$] by directing an adjustment of one or more portions of the electron-optical system 100, as described previously herein. For example, the controller 202 may include one or more processors configured to execute a set of program instructions stored in memory. The set of program instructions may be programmed to execute a selected simulation to generate the look-up table of (P,T) values. Then, the set of program instructions causes the one or more processors to determine the adjustments of the one or more portions of the electron-optical system suitable for correcting the fringe field effects [(dx,dy),dz, $d_{stig}$]. These adjustments may then be automatically carried out by the controller 202 or carried out by the controller 202 after confirmation from a user via a user interface.

In the case of beam position offset correction, ideal electron beam position P(X, Y) coordinates without existence of fringe field influence in FIG. 2C are given by:

$$X = (W-a)\cos(\theta) \quad (6\text{-}1)$$

$$Y = (W-a)\sin(\theta) \quad (6\text{-}2)$$

In this embodiment, the real electron beam position Q(x,y) coordinates with fringe field influence present in FIG. 2C are given by:

$$x = X + dx \quad (7\text{-}1)$$

$$y = Y + dy \quad (7\text{-}2)$$

where dx and dy are represented by:

$$dx = dx_0 \cos(\theta) - dy_0 \sin(\theta) \quad (8\text{-}1)$$

$$dy = dx_0 \sin(\theta) + dy_0 \cos(\theta) \quad (8\text{-}2)$$

It is noted that $(dx_0, dy_0)$ represent the real beam position at a selected constant polar angle $\theta$, e.g. at $\theta = 0$ degrees. In addition, $dx_0$, $dy_0$ are exponential functions of the edge distance a:

$$(dx_0, dy_0) = P^*\exp(-T^*a) \quad (9)$$

It is further noted the coefficients P, T are provided in the look-up table according to equation (5) above. The electron beam position offsets (dx,dy) in Eq. (8) may be corrected in a number of ways. For example, the electron beam offsets may be correct via motion mapping/correction of the stage 110, which carries the sample 112.

In the case of beam defocus correction, it is noted that the electron beam defocus due to the field curvature by the fringe dipole field, dz(θ, a), is independent of polar angle θ, i.e. dz(θ,a)=dz(a) at any given polar angles.

Further, the defocus dz(a) obeys the exponential relationship in Eq. (4). It is noted that dz(a) may be corrected in a number of ways. For example, dz(a) may be corrected by adjusting one or more focusing elements in the electron-optical column 109 of the electron-optical system 100. By way of another example, dz(a) may be corrected by adjusting the sample bias voltage via voltage control circuitry 206 where:

$$dz(a) \rightarrow dWB(a) = P^* \exp(-T^*a) \quad (10)$$

Again, the coefficients of (P,T) may be stored in the look-up table generated by controller 202 (and stored in memory).

Figure 2D:
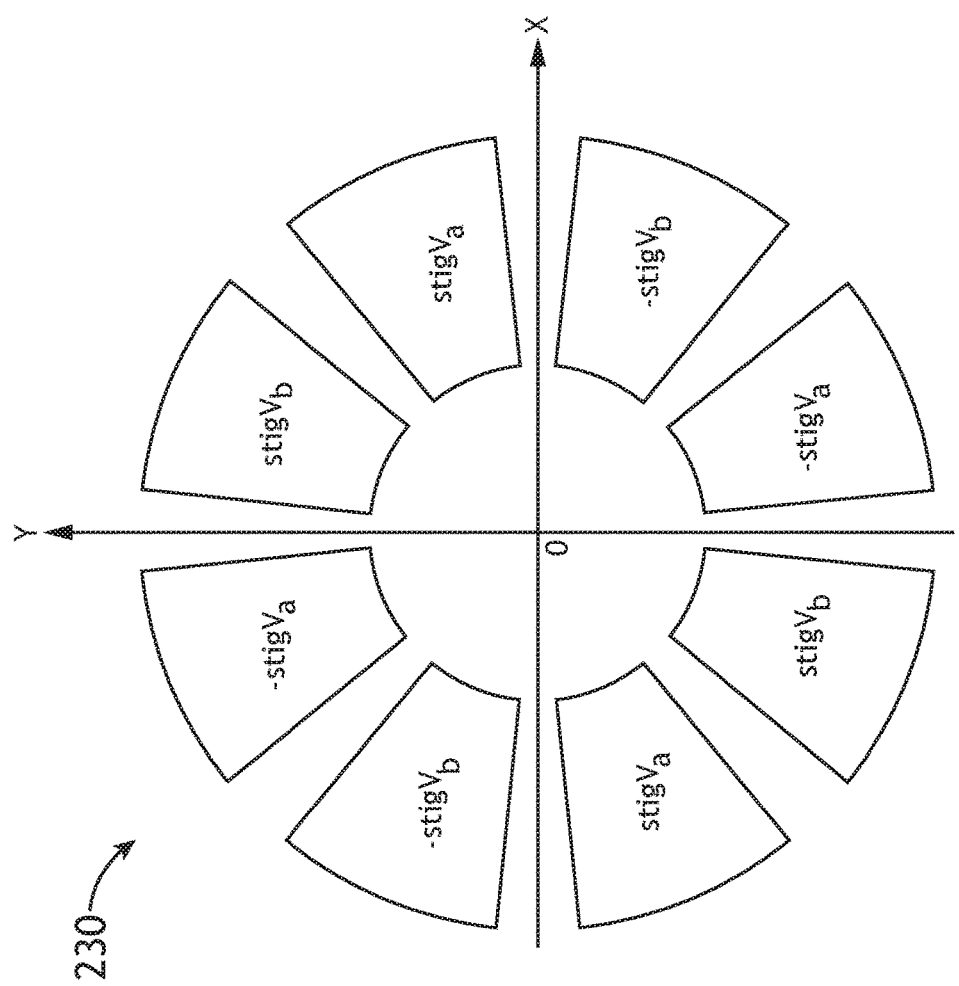
FIG. 2D illustrates a simplified schematic view of an electrostatic stigmator for applying correction voltages for correcting axial astigmatism caused by quadrupole fringe fields, in accordance with one or more embodiments of the present disclosure.

In the case of axial astigmatism correction, it is noted that axial astigmatism caused by the fringe quadrupole field at the edge of the sample may be corrected via a stigmator. FIG. 2D illustrates a simplified schematic view of an electrostatic stigmator 230 for applying correction voltages for correcting axial astigmatism caused by quadrupole fringe fields, in accordance with one or more embodiments of the present disclosure.

The stigmator 230 may take on a number of forms utilizing electrostatic and/or magnetic fields or by using multipole plates (coils) for construction. In one embodiment, as shown in FIG. 2D, the stigmator 230 includes eight plates on which astigmatism correction voltages stigV$_a$ and stigV$_b$ are applied. It is noted that the correction voltages stigV$_a$ and stigV$_b$ may be a function of the polar angle, θ, and the edge of sample distance, a, as follows:

$$stigVa(a, \theta) = Va(a) * \cos\left(2\theta + \frac{\pi}{4}\right) \quad (11\text{-}1)$$

$$stigVb(a, \theta) = Vb(a) * \sin\left(2\theta + \frac{\pi}{4}\right) \quad (11\text{-}2)$$

where the voltages V$_a$(a) and V$_b$(a) are independent of the polar angle, so they can be defined at a preferred polar angle, for instance, at θ=0 degrees in FIG. 2C. It is further noted that the voltages V$_a$(a) and V$_b$(a) have also been found to behave exponentially:

$$[Va(a), Vb(a)] = P^* \exp(-T^*a) \quad (12)$$

where the coefficients (P, T) are provided in the generated look-up table described above.

Referring again to FIG. 2A, system 100 may implement a predictive calibration technique to correct for edge of sample coordinate accuracy and stigmation, in accordance with one or more additional embodiments of the present disclosure. In one embodiment, the controller 202 may acquire experimental data and correlate the sample location information (e.g., radial and angular location) to coordinate error. In turn, the controller 202 may use this correlation to generate a look-up table for coordinate correction.

Figure 3:
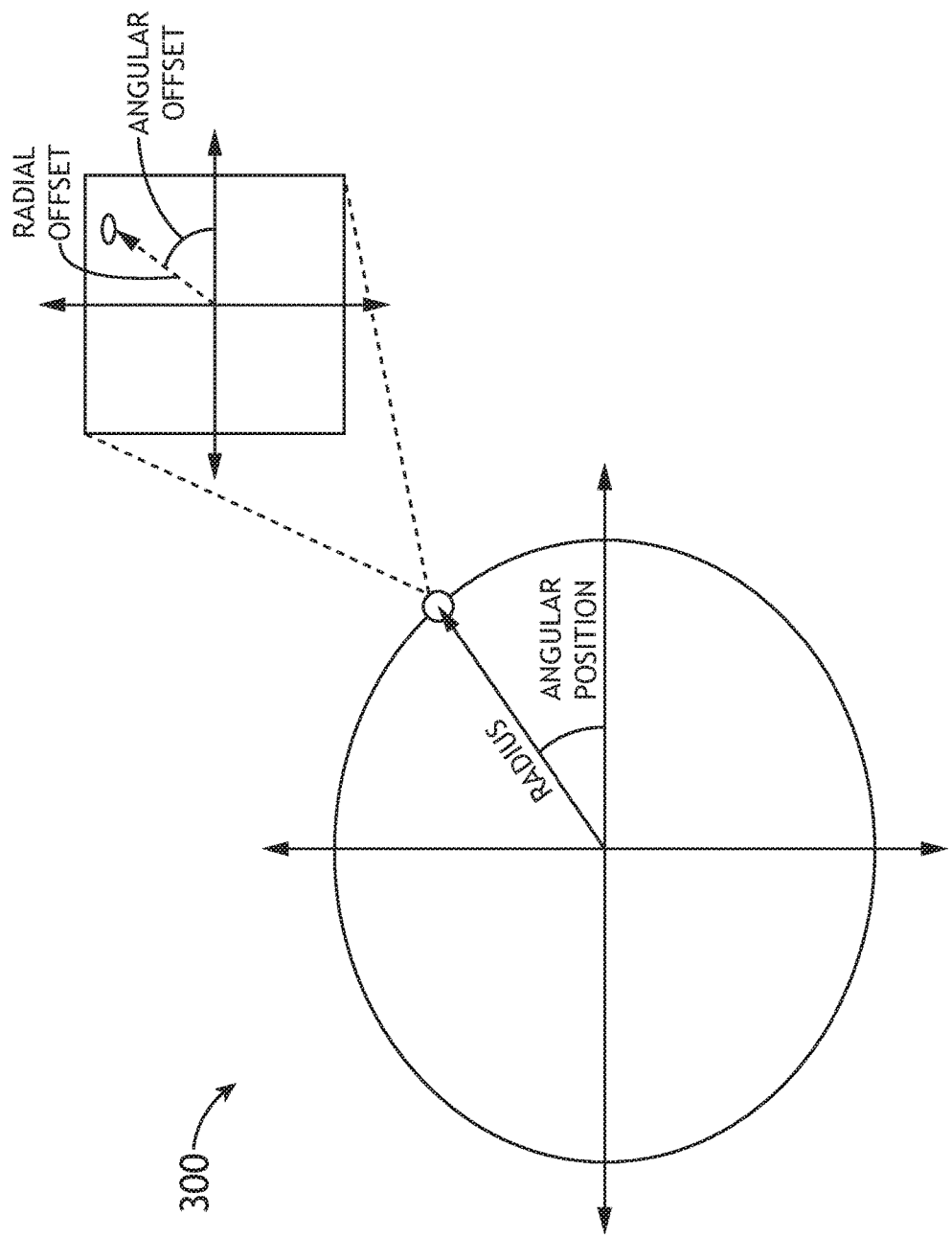
FIG. 3 illustrates a conceptual view of radial and angular offset to correct for inaccuracy and stigmation at the edge of the sample caused by fringe fields, in accordance with one or more embodiments of the present disclosure.

FIG. 3 illustrates a conceptual view 300 of the association between the radial location and the angular location and the corresponding radial offset and angular offset to correct for position inaccuracy and stigmation at the edge of the sample caused by fringe fields, in accordance with one or more embodiments of the present disclosure. It is again noted that fringe fields in the electron-optical system 100 may cause deviation/bending in the electron beam 103, resulting in poor coordinate accuracy and/or image stigmation, especially at the edge of the sample 112. These effects, again, cause poor coordinate accuracy and image quality at edge of wafer and affects the sensitivity of associated electron-optical tools.

Figure 4A:
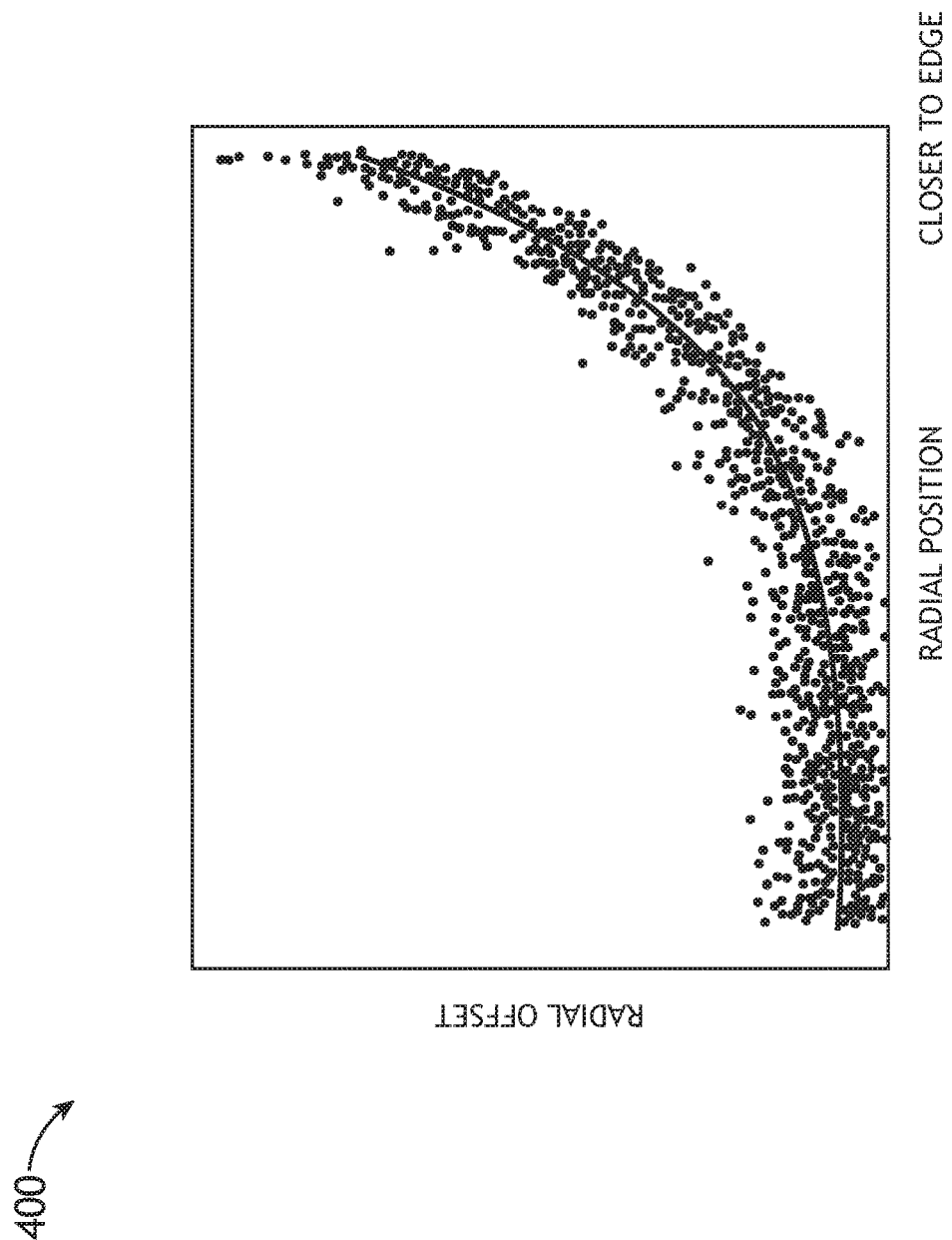
FIG. 4A illustrates a graph of offset as a function of radial position acquired from multiple tools and multiple wafers, in accordance with one or more embodiments of the present disclosure.
Figure 4B:
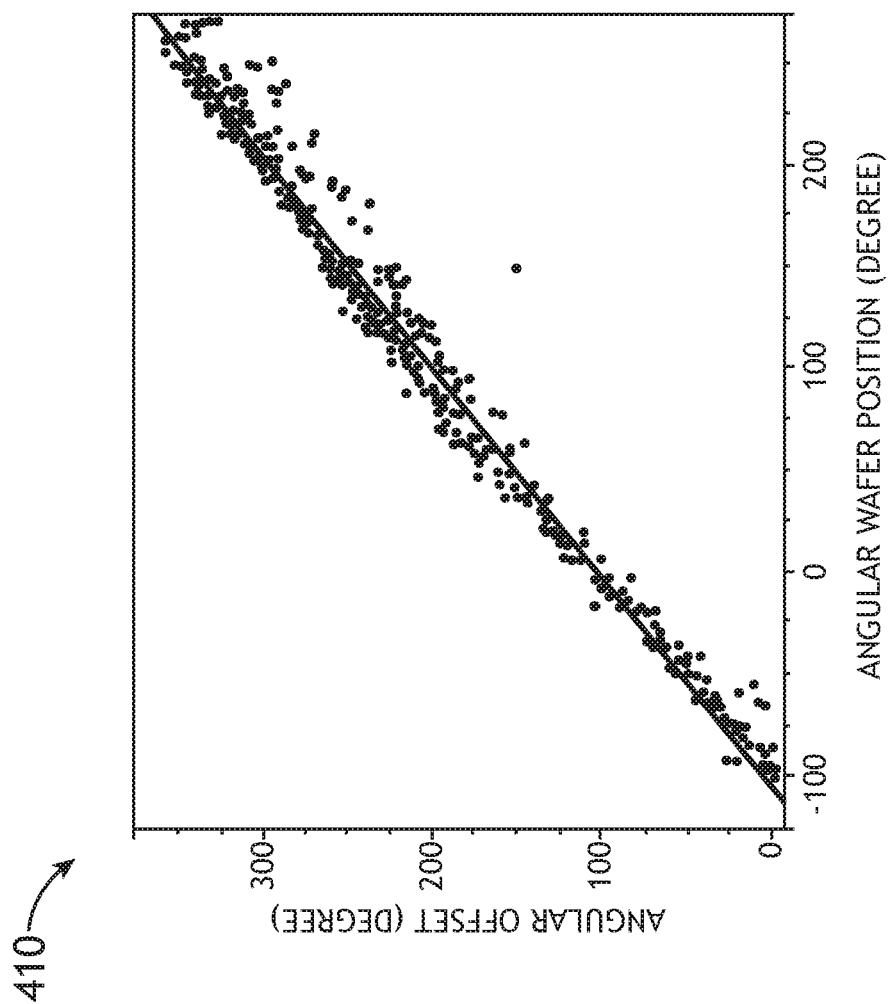
FIG. 4B illustrates a graph of offset as a function of angular position acquired from multiple tools and multiple wafers, in accordance with one or more embodiments of the present disclosure.

FIG. 4A illustrates a graph 400 of radial offset as a function of radial position acquired from multiple tools and multiple wafers, in accordance with one or more embodiments of the present disclosure. FIG. 4B illustrates a graph 410 of angular offset as a function of angular position acquired from multiple tools and multiple wafers, in accordance with one or more embodiments of the present disclosure. In one embodiment, the controller 202 may use these and similar correlations to generate a look-up table that will provide a correction factor to the coordinate system of the electron-optical system 100.

Figure 4C:
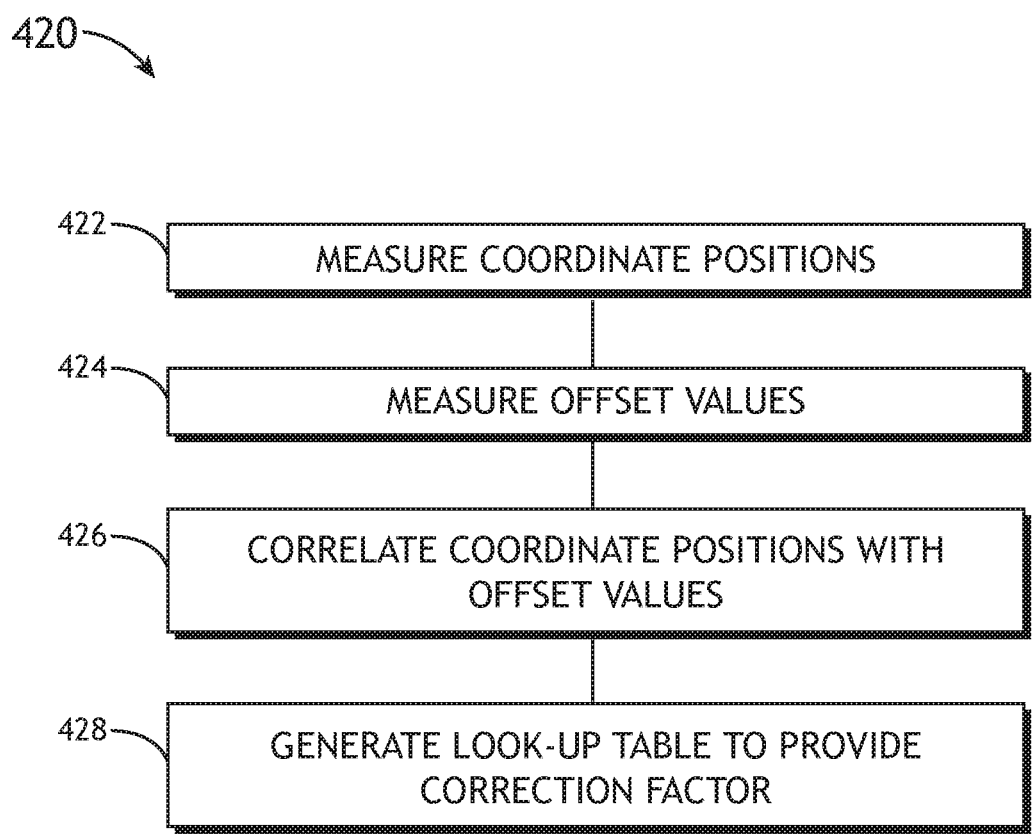
FIG. 4C illustrates a process flow diagram depicting a method of correcting position offsets in an electron beam caused by one or more fringe fields in an electron-optical system, in accordance with one or more embodiments of the present disclosure.

FIG. 4C illustrates a process flow diagram depicting a method 420 for correcting position offset error caused by one or more fringe fields at or near the edge of a sample in an electron-optical system, in accordance with one or more embodiments of the present disclosure.

In step 422, a set of measurement coordinate positions are measured. For example, a set of radial positions of the electron beam 103 across a range of radial position values are measured. By way of another example, a set of angular positions of the electron beam 103 across a range of angular position values are measured.

In step 424, a set of position offset values are measured. For example, a set of radial position offset values are measured for an electron beam 103. For instance, a radial position offset value is measure for each radial position of the electron beam 103 measured in step 422. By way of another example, a set of angular position offset values are measured for the electron beam 103. For instance, an angular position offset value is measure for each angular position of the electron beam 103 measured in step 422.

In step 426, the coordinate positions and the offset vales are correlated. For example, as shown in FIG. 4A, a relationship may be determined between the radial coordinate positions and the corresponding set of radial position offset values. By way of another example, as shown in FIG. 4B, a relationship may be determined between the angular coordinate positions and the corresponding set of angular position offset values.

In step 428, a look-up table may be generated to provide a correction factor to the electron beam 103 position. For example, based on the relationship determined in step 426, a look-up table or relationship may be established to provide a correction factor, which serves to compensate for beam offset present in the position of the beam, which, as discussed above, is function of the position of the beam.

While the description above has focused on the implementation of this embodiment in the context of position offset correction, it is recognized that this approach may be extended to correct for image stigmation.

The controller 113 and/or controller 202 may include one or more processors (not shown) configured to execute program instructions suitable for causing the one or more processors to execute one or more steps described in the present disclosure. In one embodiment, the one or more processors of the controllers 113 and/or 202 may be in communication with a memory medium (e.g., non-transitory storage medium) containing the program instructions configured to cause the one or more processors of the controller 113 and/or controller 202 to carry out various steps described through the present disclosure. It should be recognized that the various processing steps described throughout the present disclosure may be carried out by a single computing system or, alternatively, a multiple computing system. The controller 113 and/or controller 202 may include, but are not limited to, a personal computer system, mainframe computer system, workstation, image computer, parallel processor, or any other device known in the art. In general, the term "computer system" may be broadly defined to encompass any device having one or more processors or processing elements, which execute instructions from a memory medium. Moreover, different subsystems of the system 100 may include a computer system or logic elements suitable for carrying out at least a portion of the steps described above. Therefore, the above description should not be interpreted as a limitation on the present disclosure but merely an illustration.

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed:

1. A system comprising:
an electron beam source configured to generate one or more electron beams;
a sample stage configured to secure a sample;
an electron-optical column including a set of electron-optical elements configured to direct at least a portion of the one or more electron beams onto an edge portion of the sample, the set of electron-optical elements including at least one of one or more electron-optical lenses or one or more scanning elements;
a detector assembly configured to detect electrons emanating from the sample; and
a controller, wherein the controller is communicatively coupled to one or more portions of at least one of the electron beam source, the set of electron-optical elements of the electron-optical column or the sample stage, wherein the controller includes one or more processors configured for executing program instructions stored in memory, wherein the program instructions are configured to cause the one or more processors to:
receive one or more parameters representative of one or more characteristics of the one or more electron beams at the edge portion of the sample;
generate a look-up table for compensating for one or more fringe fields within the system via a simulation, wherein the generated look-up table includes a set of coefficients and corresponding fringe-field offsets, wherein the set of coefficients are a function of use conditions of electron beam energy, electron beam landing energy, and extracting field of the sample; and
adjust one or more characteristics of the system based on the generated look-up table.

2. The system of claim 1, wherein the one or more processors are communicatively coupled to a stigmator of the electron-optical column, wherein the one or more processors are configured to control the stigmator to compensate for axial astigmatism caused by the one or more fringe fields.

3. The system of claim 2, wherein the one or more processors are communicatively coupled to the one or more electron-optical lenses of the electron-optical column, wherein the one or more processors are configured to control the one or more electron-optical lenses to compensate for defocus in the one or more electron beams caused by the one or more fringe fields.

4. The system of claim 2, wherein the one or more processors are communicatively coupled to voltage control circuitry in electrical communication with the sample, wherein the one or more processors are configured to control the voltage control circuitry to adjust a bias on the sample to compensate for defocus in the one or more electron beams caused by the one or more fringe fields.

5. The system of claim 2, wherein the one or more processors are configured to control the electron source to compensate for position offset caused by the one or more fringe fields.

6. The system of claim 2, wherein the one or more processors are configured to control the sample stage to compensate for position offset caused by the one or more fringe fields.

7. The system of claim 1, wherein the electron beam source comprises:
one or more electron guns.

8. The system of claim 1, wherein the set of electron-optical elements comprises:
one or more objective lenses.

9. The system of claim 1, wherein the set of electron-optical elements comprises:
one or more condensing lenses.

10. The system of claim 1, wherein the set of electron-optical elements comprises:
one or more scanning elements.

11. The system of claim 1, wherein the sample stage is configured to secure a wafer.

12. The system of claim 1, wherein the detector assembly comprises:
at least one of one or more secondary electron detectors or one or more backscattered electron detectors.

13. A system comprising:
an electron-optical system; and
a controller, wherein the controller is communicatively coupled to one or more portions of at least one of the electron-optical system, wherein the controller includes one or more processors configured for executing program instructions stored in memory, wherein the program instructions are configured to cause the one or more processors to:
receive one or more parameters representative of one or more characteristics of one or more electron beams at an edge portion of a sample;
generate a look-up table for compensating for one or more fringe fields within the electron-optical system via a simulation, wherein the generated look-up table includes a set of coefficients and corresponding fringe-field offsets, wherein the set of coefficients are a function of use conditions of electron beam energy, electron beam landing energy, and extracting field of the sample; and
adjust one or more characteristics of the electron-optical system based on the generated look-up table.

14. The system of claim 13, wherein the electron-optical system comprises:
an electron beam source configured to generate the one or more electron beams.

15. The system of claim 13, wherein the electron-optical system comprises:
a sample stage configured to secure the sample.

16. The system of claim 15, wherein the electron-optical system comprises:
an electron-optical column including a set of electron-optical elements configured to direct at least a portion of the one or more electron beams onto an edge portion of the sample, the set of electron-optical elements including at least one of one or more electron-optical lenses or one or more scanning elements.

17. The system of claim 15, wherein the electron-optical system comprises:
a detector assembly configured to detect electrons emanating from the sample.

18. The system of claim 13, wherein the electron-optical system is configured to perform inspection of the sample.

19. The system of claim 13, wherein the electron-optical system is configured to perform review of the sample.

* * * * *